(12) United States Patent
Kim

(10) Patent No.: US 12,255,210 B2
(45) Date of Patent: Mar. 18, 2025

(54) DISPLAY DEVICE HAVING FAN-OUT AREA AND LINE PROTECTION CONFIGURATION

(71) Applicant: Samsung Display Co., LTD., Yongin-si (KR)

(72) Inventor: Yeon Kyung Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 458 days.

(21) Appl. No.: 17/841,151

(22) Filed: Jun. 15, 2022

(65) Prior Publication Data

US 2023/0014863 A1 Jan. 19, 2023

(30) Foreign Application Priority Data

Jul. 13, 2021 (KR) .................. 10-2021-0091372

(51) Int. Cl.
*H01L 27/12* (2006.01)
*H01L 23/00* (2006.01)
(Continued)

(52) U.S. Cl.
CPC .......... *H01L 27/1244* (2013.01); *H01L 24/02* (2013.01); *H01L 25/167* (2013.01); *G09G 3/32* (2013.01); *G09G 2300/0426* (2013.01); *G09G 2300/0819* (2013.01); *G09G 2300/0842* (2013.01); *H01L 24/24* (2013.01);
(Continued)

(58) Field of Classification Search
CPC ......... H01L 24/02; H01L 24/18; H01L 24/24; H01L 24/25; H01L 25/0753; H01L 25/167; H01L 27/124; H01L 27/1244; H01L 27/1248; H01L 27/156; H01L 33/62; H01L 2224/02379; H01L 2224/24145; H01L 2224/25175; G09G 3/32; G09G 2300/0426; G09G 2300/0819; G09G 2300/0842
See application file for complete search history.

(56) References Cited

U.S. PATENT DOCUMENTS

2018/0337226 A1 11/2018 Liu et al.
2021/0020724 A1 1/2021 Cho et al.

FOREIGN PATENT DOCUMENTS

KR 10-2020-0001657 1/2020
KR 10-2020-0034896 4/2020
(Continued)

OTHER PUBLICATIONS

Extended European search report for European Patent Application or Patent No. 22184321.2, dated Dec. 14, 2022.

*Primary Examiner* — Cheung Lee
(74) *Attorney, Agent, or Firm* — KILE PARK REED & HOUTTEMAN PLLC

(57) ABSTRACT

A display device includes a display area comprising pixels, a fan-out area, a pad area, a display driver, a metal layer disposed on a substrate, a data line, a first voltage line, and a second voltage line extending in a first direction on the metal layer in the display area, a fan-out line electrically connecting the data line to the display driver on the metal layer in the fan-out area, a gate line disposed on the metal layer in the display area and extending in a second direction intersecting the first direction, a source-drain layer disposed on the gate line, and an electrode layer disposed on the source-drain layer. The first voltage line includes a first plate portion disposed on the source-drain layer in the fan-out area, and the second voltage line comprises a second plate portion disposed on the electrode layer in the fan-out area.

20 Claims, 16 Drawing Sheets

(51) Int. Cl.
*H01L 25/16* (2023.01)
*G09G 3/32* (2016.01)
*H01L 33/62* (2010.01)

(52) U.S. Cl.
CPC .......... *H01L 24/25* (2013.01); *H01L 27/1248* (2013.01); *H01L 33/62* (2013.01); *H01L 2224/02379* (2013.01); *H01L 2224/24145* (2013.01); *H01L 2224/25175* (2013.01)

(56) References Cited

FOREIGN PATENT DOCUMENTS

| KR | 10-2020-0046221 | 5/2020 |
| KR | 10-2022-0094310 | 7/2022 |

SP: SP1, SP2, SP3
VL: VDDL, VSSL, VIL

RML: RME1, RMC

DISPLAY DEVICE HAVING FAN-OUT AREA AND LINE PROTECTION CONFIGURATION

CROSS-REFERENCE TO RELATED APPLICATION(S)

This application claims priority to and the benefit of Korean Patent Application No. 10-2021-0091372 under 35 U.S.C. § 119, filed on Jul. 13, 2021, in the Korean Intellectual Property Office (KIPO), the entire contents of which are incorporated herein by reference.

BACKGROUND

1. Technical Field

The disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, since each of pixels of a display panel includes a light emitting element capable of emitting light by itself, an image can be displayed without a backlight unit providing light to the display panel. The light emitting element may be an organic light emitting diode using an organic material as a fluorescent material and an inorganic light emitting diode using an inorganic material as a fluorescent material.

SUMMARY

Aspects of the disclosure provide a display device capable of reducing the size of a non-display area, protecting electrodes and lines of a display panel from static electricity, and preventing short-circuit risk in a fan-out area.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment of the disclosure, a display device may comprise a display area comprising pixels, a fan-out area disposed on a side of the display area, a pad area disposed on a side of the fan-out area, a display driver electrically connected to the pad area to drive the pixels, a metal layer disposed on a substrate, a data line, a first voltage line, and a second voltage line extending in a first direction in the metal layer in the display area, a fan-out line electrically connecting the data line to the display driver in the metal layer of the fan-out area, a gate line disposed on the metal layer of the display area and extending in a second direction crossing the first direction, a source-drain layer disposed on the gate line, and an electrode layer disposed on the source-drain layer. The first voltage line may comprise a first plate portion disposed on the source-drain layer in the fan-out area, and the second voltage line may comprise a second plate portion disposed on the electrode layer in the fan-out area.

The first voltage line may be a driving voltage line supplying a driving voltage to the pixel, and the second voltage line may be a low potential line supplying a low potential voltage to the pixel.

The first voltage line may be a low potential line supplying a low potential voltage to the pixel, and the second voltage line may be a driving voltage line supplying a driving voltage to the pixel.

A distance between the source-drain layer and the metal layer may be equal to or greater than about 10,000 angstroms (Å), and a distance between the electrode layer and the source-drain layer may be equal to or greater than about 10,000 angstroms (Å).

The display device may further comprise a buffer layer disposed on the substrate and the metal layer, a gate insulating layer disposed on the buffer layer, and an interlayer insulating layer disposed on the gate insulating layer and the gate line. A sum of thicknesses of the buffer layer, the gate insulating layer, and the interlayer insulating layer may be equal to or greater than about 10,000 angstroms (Å).

The display device may further comprise a passivation layer disposed on the source-drain layer, and a via layer disposed on the passivation layer to support the electrode layer. A sum of thicknesses of the passivation layer and the via layer may be equal to or greater than about 10,000 angstroms (Å).

The fan-out line, the first plate portion, and the second plate portion may overlap each other in a thickness direction in the fan-out area.

An area of the second plate portion may be greater than an area of the first plate portion.

A width of the second voltage line may be greater than a width of the first voltage line.

The display device may further comprise a third voltage line extending in the first direction on the metal layer in the display area. The third voltage line may be electrically connected between the pixel and the fan-out line.

According to an embodiment of the disclosure, a display device may comprise a display area comprising pixels, first and second fan-out areas, and first and second pad areas respectively corresponding to each of the first and second fan-out areas, a first display driver electrically connected to the first pad area and a second display driver electrically connected to the second pad area, a metal layer disposed on a substrate, a data line, a first voltage line, and a second voltage line extending in a first direction on the metal layer in the display area, a fan-out line electrically connecting the data line to the first display driver on the metal layer in the first fan-out area and electrically connecting the data line to the second display driver on the metal layer in the second fan-out area, a gate line disposed on the metal layer in the display area and extending in a second direction intersecting the first direction, a source-drain layer disposed on the gate line, and an electrode layer disposed on the source-drain layer. The first voltage line may comprise a first source plate portion disposed on the source-drain layer in the fan-out area, and a second electrode plate portion disposed on the electrode layer in the second fan-out area. The second voltage line may comprise a first electrode plate portion disposed on the electrode layer in the first fan-out area, and a second source plate portion disposed on the source-drain layer in the second fan-out area.

The first and second fan-out areas may be alternately disposed on a side of the display area.

The first voltage line may be a driving voltage line supplying a driving voltage to the pixel, and the second voltage line may be a low potential line supplying a low potential voltage to the pixel.

The first voltage line may be a low potential line supplying a low potential voltage to the pixel, and the second voltage line may be a driving voltage line supplying a driving voltage to the pixel.

A distance between the source-drain layer and the metal layer may be equal to or greater than about 10,000 angstroms (Å), and a distance between the electrode layer and the source-drain layer may be equal to or greater than about 10,000 angstroms (Å).

The display device may further comprise a buffer layer disposed on the substrate and the metal layer, a gate insulating layer disposed on the buffer layer, and an interlayer insulating layer disposed on the gate insulating layer and the gate line. A sum of thicknesses of the buffer layer, the gate insulating layer, and the interlayer insulating layer may be equal to or greater than about 10,000 angstroms (Å).

The display device may further comprise a passivation layer disposed on the source-drain layer, and a via layer disposed on the passivation layer to support the electrode layer. A sum of thicknesses of the passivation layer and the via layer may be equal to or greater than about 10,000 angstroms (Å).

An area of the first electrode plate portion may be greater than an area of the first source plate portion, and an area of the second electrode plate portion may be greater than an area of the second source plate portion.

The fan-out line, the first source plate portion, and the first electrode plate portion may overlap each other in a thickness direction of the display device in the first fan-out area. The fan-out line, the second source plate portion, and the second electrode plate portion may overlap each other in the thickness direction in the second fan-out area.

The display device may further comprise a third voltage line extending in the first direction on the metal layer in the display area. The third voltage line may be electrically connected between the pixel and the fan-out line.

By including a fan-out line disposed in a metal layer of a fan-out area, a first voltage line disposed in a source-drain layer, and a second voltage line disposed in an electrode layer, a display device according to embodiments of the disclosure is capable of reducing the size of the fan-out area, protecting electrodes and lines of a display panel from static electricity, and preventing short-circuit risk in the fan-out area.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail example embodiments thereof with reference to the attached drawings, in which.

DETAILED DESCRIPTION OF THE EMBODIMENTS

Figure 1:
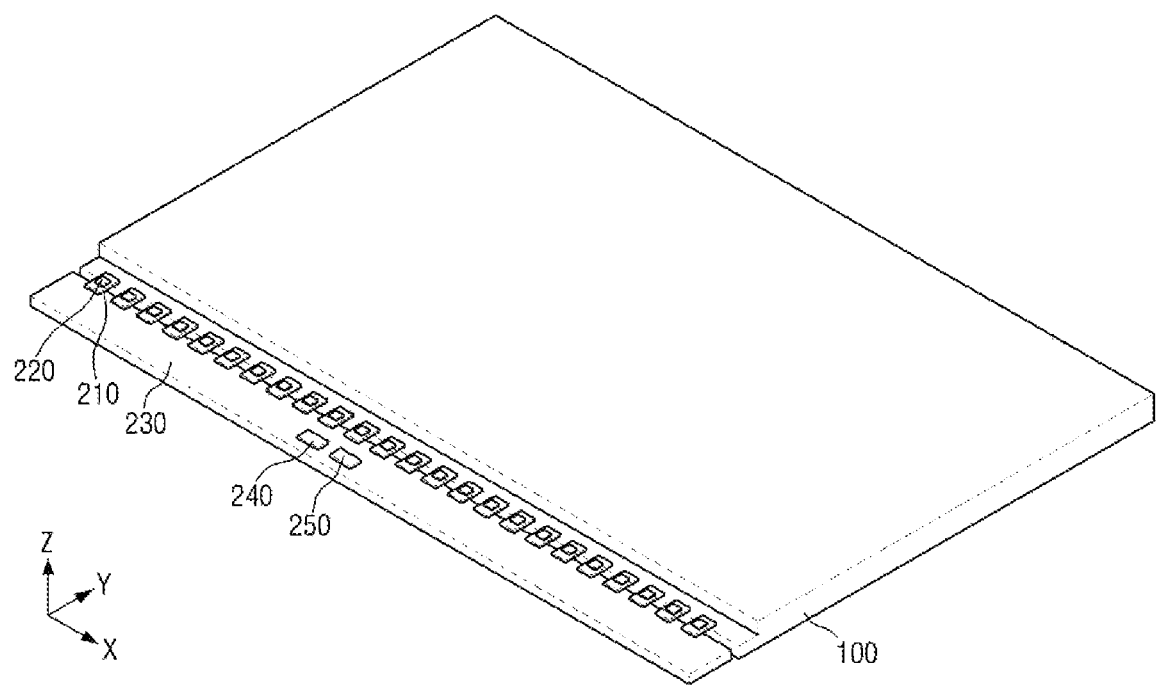
FIG. 1 is a schematic perspective view illustrating a display device according to an embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the spirit and scope of the disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or."

Although the terms "first," "second," or the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or "to not overlap" another element, this may include that the elements are spaced from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the spirit and scope of the disclosure. Further, the blocks, units, and/or modules of some or a number of embodiments may be physically combined into more complex blocks, units, and/or modules without departing from the spirit and scope of the disclosure.

Unless otherwise defined or implied herein, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
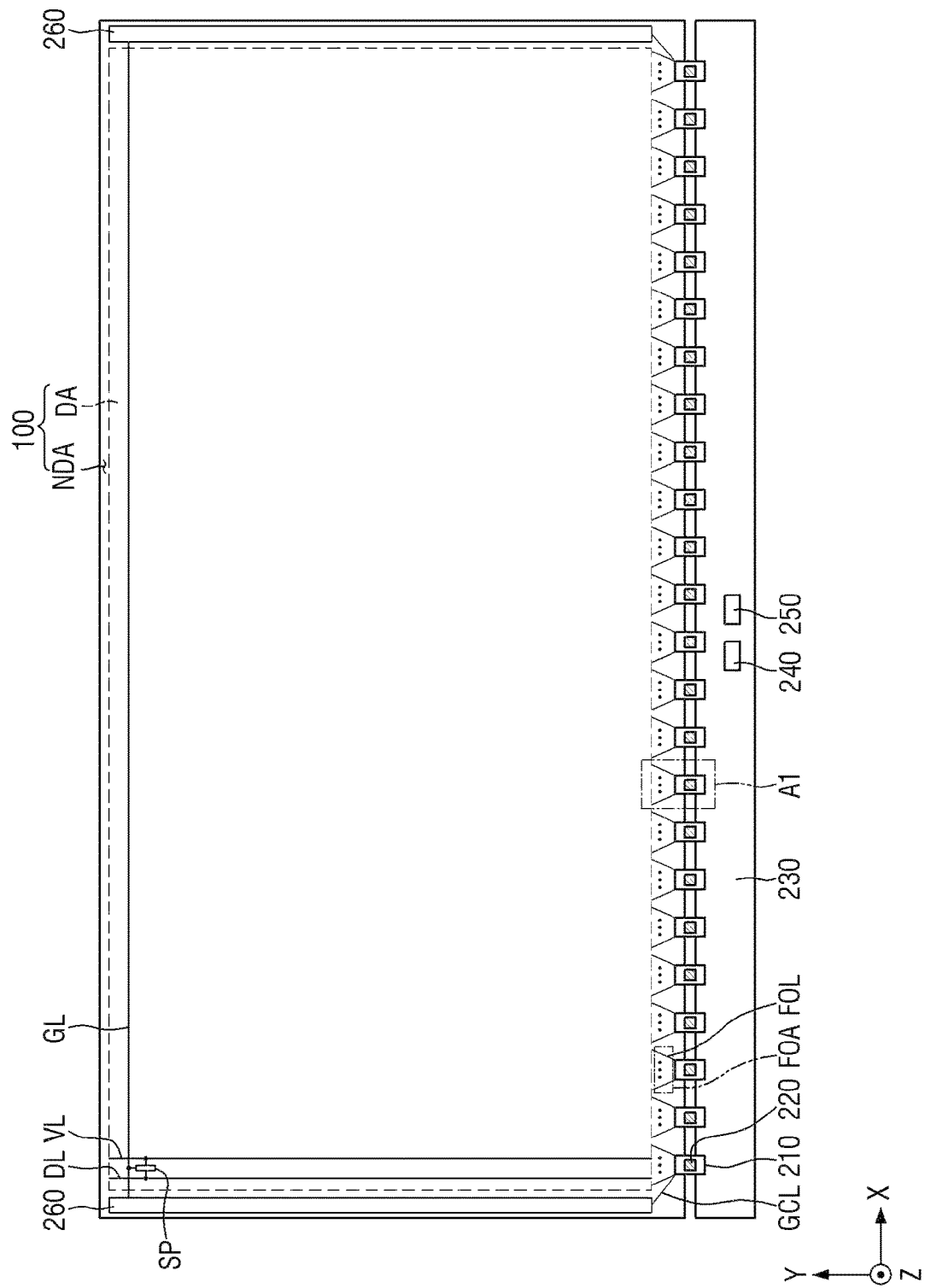
FIG. 2 is a schematic plan view illustrating a display device according to an embodiment.

FIG. 1 is a schematic perspective view illustrating a display device according to an embodiment. FIG. 2 is a schematic plan view illustrating a display device according to an embodiment.

The terms "above," "top," and "top surface" as used herein refer to an upward direction (for example, a Z-axis direction) with respect to the display device. The terms "below," "bottom," and "bottom surface" as used herein refer to a downward direction (for example, a direction opposite to the Z-axis direction) with respect to the display device. Further, the terms "left," "right," "upper," and "lower" respectively indicate corresponding directions on the surface of the display device. For example, the term "left" indicates a direction opposite to an X-axis direction, the term "right" indicates the X-axis direction, the term "upper" indicates a Y-axis direction, and the term "lower" indicates a direction opposite to the Y-axis direction.

Referring to FIGS. 1 and 2, a display device, as a device for displaying a moving or still image, may be employed as a display screen of various products such as a television, a laptop computer, a monitor, a billboard, and an Internet of things (IoT) device as well as portable electronic devices such as a mobile phone, a smartphone, a tablet personal computer (PC), a smartwatch, a watchphone, a mobile communication terminal, an electronic notebook, an eBook reader, a portable multimedia player (PMP), a navigation device, and an ultra-mobile PC (UMPC).

The display device may include a display panel 100, a flexible film 210, a display driver 220, a circuit board 230, a timing controller 240, a power supply part 250, and a gate driver 260.

The display panel 100 may have a rectangular shape in a plan view. For example, the display panel 100 may have a rectangular shape, in a plan view, having long sides in a first direction (e.g., X-axis direction) and short sides in a second direction (e.g., Y-axis direction). A corner formed by the long side in the first direction (e.g., X-axis direction) and the short side in the second direction (e.g., Y-axis direction) may be right-angled or rounded with a predetermined (or selected) curvature. The planar shape of the display panel 100 is not limited to the rectangular shape, and may be formed in a polygonal shape, a circular shape, or an elliptical shape. For example, the display panel 100 may be formed to be flat, but the disclosure is not limited thereto. In another example, the display panel 100 may be bent with a predetermined curvature.

The display panel 100 may include a display area DA and a non-display area NDA.

The display area DA, which is an area for displaying an image, may be defined as a central area of the display panel 100. The display area DA may include pixels SP formed in pixel areas defined by data lines DL and gate lines GL intersecting each other. Each of the pixels SP may be electrically connected to a gate line GL, a data line DL, and a power line VL. Each of the pixels SP may be defined as an area of the smallest unit that outputs light.

The gate lines GL may extend in the first direction (e.g., X-axis direction) and may be spaced apart from each other in the second direction (e.g., Y-axis direction). The gate lines GL may sequentially supply gate signals received from the gate driver 260 to the pixels SP.

The data lines DL may extend in the second direction (e.g., Y-axis direction) and may be spaced apart from each other in the first direction (e.g., X-axis direction). The data lines DL may supply data voltages received from the display driver 220 to the pixels SP.

The power lines VL may extend in the second direction (e.g., Y-axis direction) and may be spaced apart from each other in the first direction (e.g., X-axis direction). The power lines VL may supply a power voltage received from the power supply part 250 to the pixels SP. For example, the power voltage may include, but not limited to, a driving voltage, a low-potential voltage, and an initialization voltage.

The non-display area NDA may be defined as the remaining area except for the display area DA. The non-display area NDA may include a fan-out area FOA and a pad area. The fan-out area FOA and the pad area may be disposed on a side of the non-display area NDA. The fan-out area FOA may include fan-out lines FOL electrically connecting the data lines DL to the display driver 220. The pad area may include pad portions electrically connected to the flexible film 210.

The flexible film 210 may be electrically connected between the display panel 100 and the circuit board 230. Input terminals provided on a side of the flexible film 210 may be attached to the circuit board 230 by a film attaching process, and output terminals provided on another side of the flexible film 210 may be attached to the pad portion of the display panel 100 by the film attaching process. For example, the flexible film 210 may be a flexible film that can be bent, such as a tape carrier package or a chip on film. The flexible film 210 may be bent toward a lower portion of the display panel 100 to reduce a bezel area of the display device.

The display driver 220 may be mounted on the flexible film 210. For example, the display driver 220 may be implemented as an integrated circuit (IC). The display driver 220 may receive digital video data and a data control signal from the timing controller 240 and based on the data control signal, convert the digital video data to an analog data voltage to supply it to the data lines DL through the fan-out lines FOL. Further, the display driver 220 may supply a gate control signal supplied from the timing controller 240 to the gate driver 260 through a gate control line GCL.

The circuit board 230 may support the timing controller 240 and the power supply part 250 and transmit signals and power between components of the display driver 200. By way of example, the circuit board 230 may supply the signal supplied from the timing controller 240 and the power voltage supplied from the power supply part 250 to the display driver 220. To this end, a signal line and a power line may be provided on the circuit board 230.

The timing controller 240 may be mounted on the circuit board 230 and receive image data and a timing synchronization signal supplied from a display driving system through a user connector provided on the circuit board 230. The timing controller 240 may generate digital video data by arranging the image data to fit a pixel arrangement structure based on the timing synchronization signal, and may supply the generated digital video data to the corresponding display driver 220. The timing controller 240 may generate the data control signal and the gate control signal based on the timing synchronization signal. The timing controller 240 may control the data voltage supply timing of the display driver 220 based on the data control signal, and may control the gate signal supply timing of the gate driver 260 based on the gate control signal.

The power supply part 250 may be disposed on the circuit board 230 to supply a power voltage to the display driver 220 and the display panel 100. For example, the power supply part 250 may generate the driving voltage to supply it to a driving voltage line, generate the low-potential voltage to supply it to a low-potential line, and generate the initialization voltage to supply it to an initialization voltage line.

The gate driver 260 may be disposed on the other side of the non-display area NDA adjacent to the side thereof. For example, the fan-out area FOA and the pad area may be disposed on a lower side of the non-display area NDA, and the gate driver 260 may be disposed on a left side of the non-display area NDA, but the disclosure is not limited thereto. The gate driver 260 may generate gate signals based on the gate control signal received through the gate control line GCL, and supply them sequentially to the gate lines GL in a set order.

Figure 3:
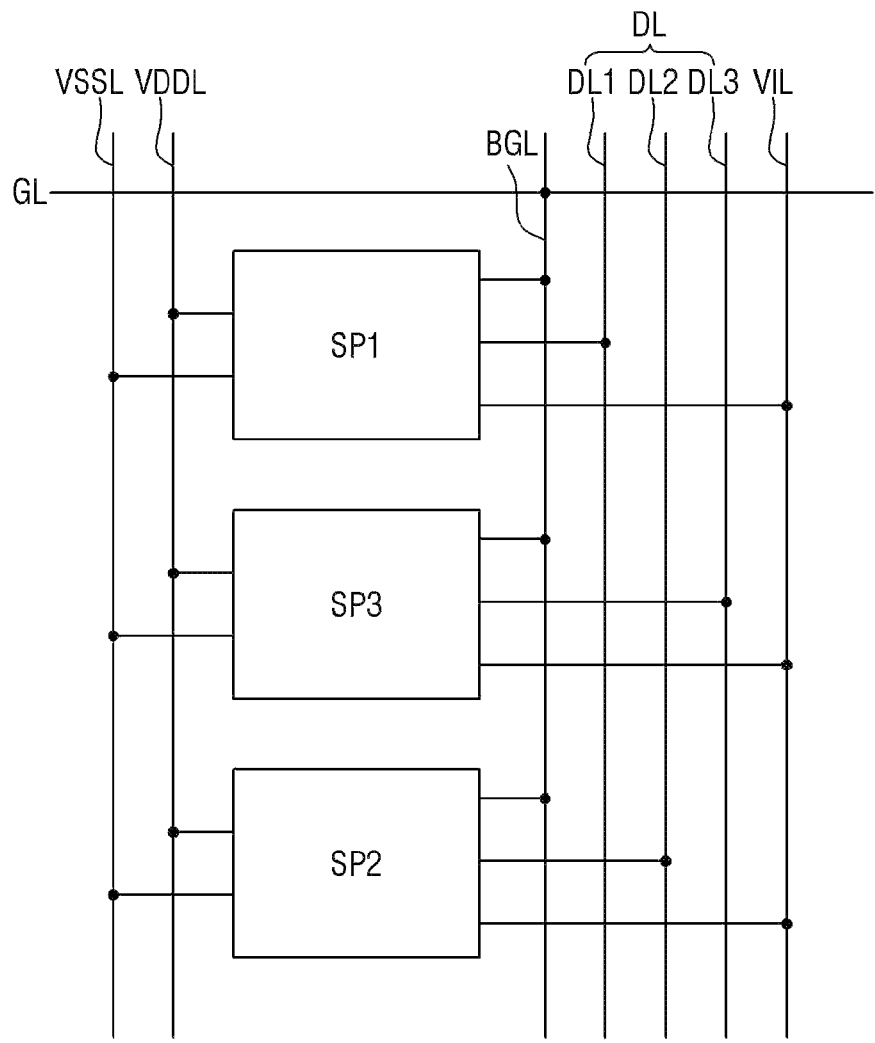
FIG. 3 is a schematic diagram illustrating pixels and lines in a display device according to an embodiment.

FIG. 3 is a schematic diagram illustrating pixels and lines in a display device according to an embodiment.

Referring to FIG. 3, the pixels SP may include first to third pixels SP1, SP2, and SP3. The first pixel SP1 may be a red pixel that outputs red light, the second pixel SP2 may be a green pixel that outputs green light, and the third pixel SP3 may be a blue pixel that outputs blue light, but the disclosure is not limited thereto. Pixel circuits of the first pixel SP1, the third pixel SP3 and the second pixel SP2 may be arranged in an opposite direction of the second direction (e.g., Y-axis direction), but the arrangement direction of the pixel circuits is not limited thereto.

Power lines VL may extend in the second direction (e.g., Y-axis direction). The power lines VL may include a driving voltage line VDDL, a low-potential line VSSL, and an initialization voltage line VIL. For example, the driving voltage line VDDL may be a first voltage line that supplies a first voltage, the low-potential line VSSL may be a second voltage line that supplies a second voltage, and the initialization voltage line VIL may be a third voltage line that supplies a third voltage.

The driving voltage line VDDL may extend in the second direction (e.g., Y-axis direction). The driving voltage line VDDL may be disposed on a side or a left side of the first to third pixels SP1, SP2, and SP3. The driving voltage line VDDL may supply the driving voltage or a high-potential voltage to the pixels SP. For example, the driving voltage line VDDL may supply the driving voltage to transistors of each of the first to third pixels SP1 to SP3.

The low-potential line VSSL may extend in the second direction (e.g., Y-axis direction). The low-potential line VSSL may be disposed on a side or a left side of the driving voltage line VDDL. The low-potential line VSSL may supply the low-potential voltage to the pixels SP. For example, the low-potential line VSSL may supply the low-potential voltage to second electrodes or cathode electrodes of light emitting elements of the first to third pixels SP1, SP2, and SP3. As another example, the low-potential line VSSL may be disposed on another side or a right side of the driving voltage line VDDL.

A gate line GL may extend in the first direction (e.g., X-axis direction). The gate line GL may be disposed above the first pixel SP1. The gate line GL may be electrically connected between the gate driver 260 and an auxiliary gate line BGL. The gate line GL may supply gate signals to the pixels SP through the auxiliary gate line BGL.

The auxiliary gate line BGL may extend from the gate line GL in the opposite direction of the second direction (e.g., Y-axis direction). The auxiliary gate line BGL may be disposed on another side or a right side of the first to third pixels SP1, SP2, and SP3. The auxiliary gate line BGL may supply the gate signals received from the gate line GL to the transistors of each of the first to third pixels SP1, SP2, and SP3.

Data lines DL may extend in the second direction (e.g., Y-axis direction). The data lines DL may supply the data voltage to the pixels SP. The data lines DL may include first to third data lines DL1, DL2, and DL3.

The first data line DL1 may extend in the second direction (e.g., Y-axis direction). The first data line DL1 may be disposed on another side or a right side of the auxiliary gate line BGL. The first data line DL1 may supply the data voltage received from the display driver 220 to the first pixel SP1.

The second data line DL2 may extend in the second direction (e.g., Y-axis direction). The second data line DL2 may be disposed on another side or a right side of the first data line DL1. The second data line DL2 may supply the data voltage received from the display driver 220 to the second pixel SP2.

The third data line DL3 may extend in the second direction (e.g., Y-axis direction). The third data line DL3 may be disposed on another side or a right side of the second data line DL2. The third data line DL3 may supply the data voltage received from the display driver 220 to the third pixel SP3.

The initialization voltage line VIL may extend in the second direction (e.g., Y-axis direction). The initialization voltage line VIL may be disposed on another side or a right side of the third data line DL3. The initialization voltage line VIL may supply the initialization voltage received from the display driver 220 to each of the first to third pixels SP1, SP2, and SP3.

Figure 4:
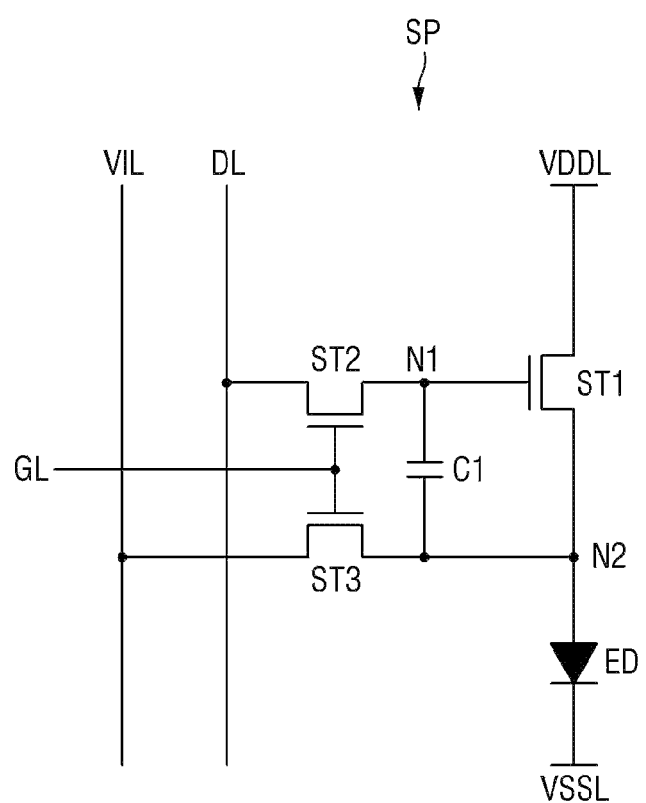
FIG. 4 is a schematic diagram of an equivalent circuit illustrating a pixel of a display device according to an embodiment.

FIG. 4 is a schematic diagram of an equivalent circuit illustrating a pixel of a display device according to an embodiment.

Referring to FIG. 4, each of the pixels may be electrically connected to the gate line GL, the data line DL, the driving voltage line VDDL, the low-potential line VSSL, and the initialization voltage line VIL.

Each of the pixels SP may include switching elements, a storage capacitor C1 and light emitting elements ED. The switching elements may include first to third transistors ST1, ST2, and ST3.

The first transistor ST1 may include a gate electrode, a drain electrode, and a source electrode. The gate electrode of the first transistor ST1 may be electrically connected to a first node N1, the drain electrode thereof may be electrically connected to the driving voltage line VDDL, and the source electrode thereof may be electrically connected to a second node N2. The first transistor ST1 may control a source-drain current (or a driving current) according to the data voltage applied to the gate electrode.

The light emitting elements ED may emit light by receiving the driving current. The light emission amount or the luminance of the light emitting element ED may be proportional to the magnitude of the driving current. The light emitting element ED may be an inorganic light emitting element including a first electrode, a second electrode, and an inorganic semiconductor disposed between the first electrode and the second electrode. The first electrode of the light emitting element ED may be electrically connected to the second node N2, and the second electrode of the light emitting element ED may be electrically connected to the low-potential line VSSL. The first electrode of the light emitting element ED may be electrically connected to the source electrode of the first transistor ST1, a source electrode of the third transistor ST3 and a second capacitor electrode of the storage capacitor C1 through the second node N2.

For example, the light emitting elements ED may be electrically connected in series between the second node N2 and the low-potential line VSSL. As another example, the light emitting elements ED may be electrically connected in parallel between the second node N2 and the low-potential line VSSL. As still another example, the light emitting elements ED may be electrically connected in series and parallel between the second node N2 and the low-potential line VSSL.

The second transistor ST2 may be turned on by a gate signal from the gate line GL to electrically connect the data line DL to the first node N1 which is the gate electrode of the first transistor ST1. The second transistor ST2 may be turned on according to the gate signal to supply the data voltage to the first node N1. A gate electrode of the second transistor ST2 may be electrically connected to the gate line GL, a drain electrode thereof may be electrically connected to the data line DL, and a source electrode thereof may be electrically connected to the first node N1. The source electrode of the second transistor ST2 may be electrically connected to the gate electrode of the first transistor ST1 and a first capacitor electrode of the storage capacitor C1 through the first node N1.

The third transistor ST3 may be turned on by a gate signal from the gate line GL to electrically connect the initialization voltage line VIL to the second node N2 that is the source electrode of the first transistor ST1. The third transistor ST3 may be turned on according to the gate signal to supply the initialization voltage to the second node N2. A gate electrode of the third transistor ST3 may be electrically connected to the gate line GL, a drain electrode thereof may be electrically connected to the initialization voltage line VIL, and the source electrode thereof may be electrically connected to the second node N2. The source electrode of the third transistor ST3 may be electrically connected to the source electrode of the first transistor ST1, the second capacitor electrode of the storage capacitor C1, and the first electrode of the light emitting element ED through the second node N2.

Figure 5:
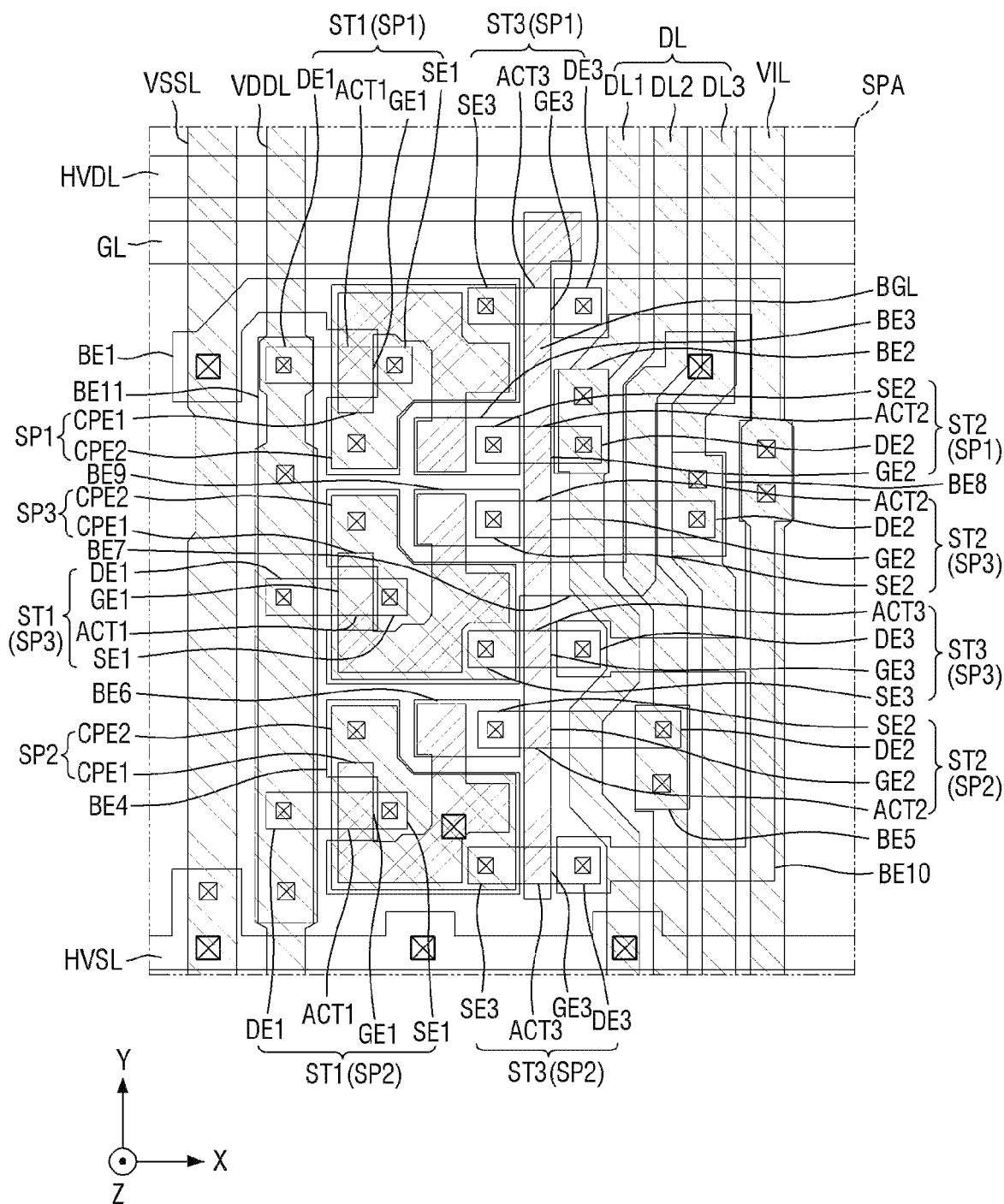
FIGS. 5 and 6 are schematic plan views illustrating a pixel area in a display device according to an embodiment.
Figure 6:
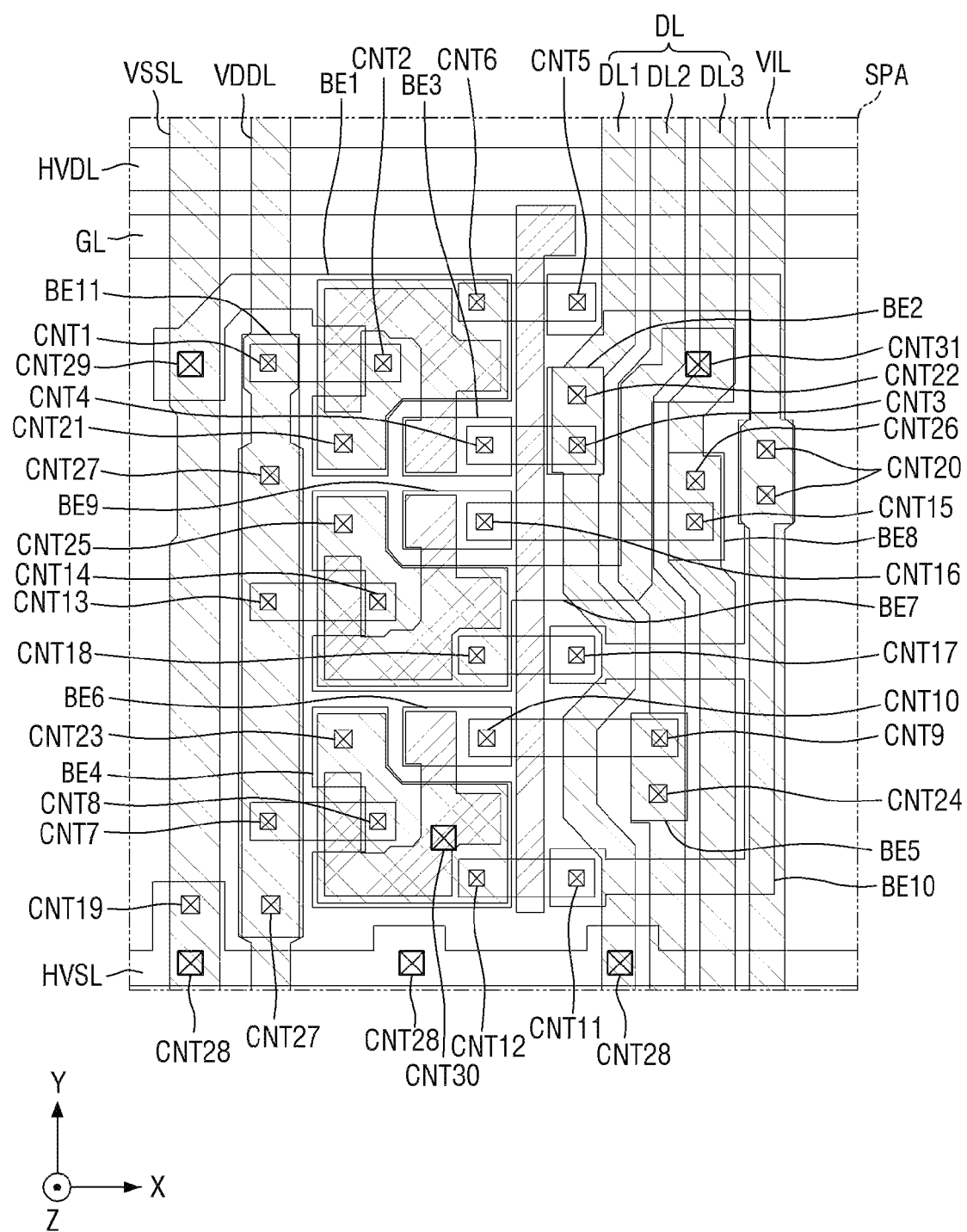

FIGS. 5 and 6 are schematic plan views illustrating a pixel area in a display device according to an embodiment. FIGS. 5 and 6 illustrate a same layout with different reference numerals therein.

Referring to FIGS. 5 and 6, the display panel 100 may include pixel areas SPA. Each of the pixel areas SPA may include the first to third pixels SP1, SP2, and SP3. The pixel circuit of the first pixel SP1, the pixel circuit of the third pixel SP3, and the pixel circuit of the second pixel SP2 may be arranged in the opposite direction of the second direction (e.g., Y-axis direction).

The driving voltage line VDDL may be disposed on a left side of the pixel circuits of the first to third pixels SP1, SP2, and SP3. The driving voltage line VDDL may be electrically connected to a drain electrode DE1 of a first transistor ST1 of the first pixel SP1 through a first contact hole CNT1, electrically connected to a drain electrode DE1 of a first transistor ST1 of the second pixel SP2 through a seventh contact hole CNT7, and electrically connected to a drain electrode DE1 of a first transistor ST1 of the third pixel SP3 through a thirteenth contact hole CNT13. Accordingly, the driving voltage line VDDL may supply a driving voltage or a high-potential voltage to the first to third pixels SP1, SP2, and SP3.

A horizontal driving voltage line HVDL may be disposed above the gate line GL. The horizontal driving voltage line HVDL may extend in the first direction (e.g., X-axis direction). The horizontal driving voltage line HVDL may receive the driving voltage from the driving voltage line VDDL. The horizontal driving voltage line HVDL may supply the driving voltage to an alignment electrode of each of the first to third pixels SP1, SP2, and SP3.

The low-potential voltage line VSSL may be disposed on the left side of the driving voltage line VDDL. The low-potential line VSSL may be a low-potential voltage line that supplies the low-potential voltage to the pixels SP. The low-potential line VSSL may be electrically connected to a horizontal low-potential line HVSL through a nineteenth contact hole CNT19.

The horizontal low-potential line HVSL may be disposed under the pixel circuits of the first to third pixels SP1, SP2, and SP3. The horizontal low-potential line HVSL may extend in the first direction (e.g., X-axis direction). The horizontal low-potential line HVSL may be electrically connected to a second electrode of an electrode layer through a twenty-eighth contact hole CNT28. The horizontal low-potential line HVSL may supply the low-potential voltage received from the low-potential line VSSL to a second electrode of each of the first to third pixels SP1, SP2, and SP3.

The gate line GL may be disposed above the pixel circuits of the first to third pixels SP2, SP2, and SP3. The gate line GL may supply the gate signal received from the gate driver 260 to the auxiliary gate line BGL.

The auxiliary gate line BGL may be disposed on a right side of the pixel circuits of the first to third pixels SP1, SP2, and SP3. The auxiliary gate line BGL may supply the gate signals received from the gate line GL to the pixel circuits of the first to third pixels SP1, SP2, and SP3.

The first data line DL1 may be disposed on the right side of the auxiliary gate line BGL. The first data line DL1 may be electrically connected to a second connection electrode BE2 through a twenty-second contact hole CNT22, and the second connection electrode BE2 may be electrically connected to a drain electrode DE2 of a second transistor ST2 of the first pixel SP1 through a third contact hole CNT3. Accordingly, the first data line DL1 may supply the data voltage to the second transistor ST2 of the first pixel SP1.

The second data line DL2 may be disposed on the right side of the first data line DL1. The second data line DL2 may be electrically connected to a fifth connection electrode BE5 through a twenty-fourth contact hole CNT24, and the fifth connection electrode BE5 may be electrically connected to a drain electrode DE2 of a second transistor ST2 of the second pixel SP2 through a ninth contact hole CNT9. Accordingly, the second data line DL2 may supply the data voltage to the second transistor ST2 of the second pixel SP2.

The third data line DL3 may be disposed on the right side of the second data line DL2. The third data line DL3 may be electrically connected to an eighth connection electrode BE8 through a twenty-sixth contact hole CNT26, and the eighth connection electrode BE8 may be electrically connected to a drain electrode DE2 of a second transistor ST2 of the third pixel SP3 through a fifteenth contact hole CNT15. Accordingly, the third data line DL3 may supply the data voltage to the second transistor ST2 of the third pixel SP3.

The initialization voltage line VIL may be disposed on the right side of the third data line DL3. The initialization voltage line VIL may be electrically connected to a tenth connection electrode BE10 through twentieth contact holes CNT20. The tenth connection electrode BE10 may be electrically connected to a drain electrode DE3 of a third transistor ST3 of the first pixel SP1 through a fifth contact hole CNT5, electrically connected to a drain electrode DE3 of a third transistor ST3 of the second pixel SP2 through an eleventh contact hole CNT11, and electrically connected to a drain electrode DE3 of a third transistor ST3 of the third pixel SP3 through a seventeenth contact hole CNT17. Accordingly, the initialization voltage line VIL may supply the initialization voltage to the third transistor ST3 of each of the first to third pixels SP1, SP2, and SP3 and receive a sensing signal from the third transistor ST3.

The pixel circuit of the first pixel SP1 may include first to third transistors ST1, ST2, and ST3. The first transistor ST1 of the first pixel SP1 may include an active region ACT1, a gate electrode GE1, a drain electrode DE1, and a source electrode SE1. The active region ACT1 of the first transistor ST1 may overlap the gate electrode GE1 of the first transistor ST1 in the thickness direction (e.g., Z-axis direction).

The gate electrode GE1 of the first transistor ST1 may be a part of a first capacitor electrode CPE1 of the storage capacitor C1. The first capacitor electrode CPE1 may be electrically connected to a third connection electrode BE3, and the third connection electrode BE3 may be electrically connected to a source electrode SE2 of the second transistor ST2 through a fourth contact hole CNT4.

The drain electrode DE1 and the source electrode SE1 of the first transistor ST1 may be turned into conductors by heat treatment on the material of the active region ACT1. The drain electrode DE1 of the first transistor ST1 may be electrically connected to an eleventh connection electrode BE11 through the first contact hole CNT1, and the eleventh connection electrode BE11 may be electrically connected to the driving voltage line VDDL through twenty-seventh contact holes CNT27. The drain electrode DE1 of the first transistor ST1 may receive the driving voltage from the driving voltage line VDDL.

The source electrode SE1 of the first transistor ST1 may be electrically connected to a first connection electrode BE1 through a second contact hole CNT2. The first connection electrode BE1 may be electrically connected to a second capacitor electrode CPE2 through a twenty-first contact hole CNT21. Accordingly, the storage capacitor C1 may be formed doubly between the first capacitor electrode CPE1 and the second capacitor electrode CPE2 and between the first capacitor electrode CPE1 and the first connection electrode BE1.

The first connection electrode BE1 may be electrically connected to a source electrode SE3 of the third transistor ST3 through a sixth contact hole CNT6. The first connection electrode BE1 may be electrically connected to the first electrode of the electrode layer through a twenty-ninth contact hole CNT29.

The second transistor ST2 of the first pixel SP1 may include an active region ACT2, a gate electrode GE2, a drain electrode DE2, and a source electrode SE2. The active region ACT2 of the second transistor ST2 may overlap the gate electrode GE2 of the second transistor ST2 in the thickness direction (e.g., Z-axis direction). The gate electrode GE2 of the second transistor ST2 may be a part of the auxiliary gate line BGL.

The drain electrode DE2 of the second transistor ST2 may be electrically connected to the second connection electrode BE2 through the third contact hole CNT3, and the second connection electrode BE2 may be electrically connected to the first data line DL1 through the twenty-second hole CNT22. The drain electrode DE2 of the second transistor ST2 may receive the data voltage of the first pixel SP1 from the first data line DL1.

The source electrode SE2 of the second transistor ST2 may be electrically connected to the third connection electrode BE3 through the fourth contact hole CNT4. The third connection electrode BE3 may be electrically connected to the first capacitor electrode CPE1 to be electrically connected to the gate electrode GE1 of the first transistor ST1.

The third transistor ST3 of the first pixel SP1 may include an active region ACT3, a gate electrode GE3, a drain electrode DE3, and a source electrode SE3. The active region ACT3 of the third transistor ST3 may overlap the gate electrode GE3 in the thickness direction (e.g., Z-axis direction). The gate electrode GE3 of the third transistor ST3 may be a part of the auxiliary gate line BGL.

The drain electrode DE3 of the third transistor ST3 may be electrically connected to the tenth connection electrode BE10 through the fifth contact hole CNT5. The tenth connection electrode BE10 may be electrically connected to the initialization voltage line VIL through the twentieth contact holes CNT20. The drain electrode DE3 of the third transistor ST3 may receive the initialization voltage from the initialization voltage line VIL. The drain electrode DE3 of the third transistor ST3 may supply the sensing signal to the initialization voltage line VIL.

The source electrode SE3 of the third transistor ST3 may be electrically connected to the first connection electrode BE1 through the sixth contact hole CNT6. The first connection electrode BE1 may be electrically connected to the source electrode SE1 of the first transistor ST1 through the second contact hole CNT2, electrically connected to the second capacitor electrode CPE2 through a twenty-first contact hole CNT21, and electrically connected to the first electrode of the electrode layer through the twenty-ninth contact hole CNT29.

The pixel circuit of the second pixel SP2 may include first to third transistors ST1, ST2, and ST3. The first transistor ST1 of the second pixel SP2 may include an active region ACT1, a gate electrode GE1, a drain electrode DE1, and a source electrode SE1. The active region ACT1 of the first transistor ST1 may overlap the gate electrode GE1 of the first transistor ST1 in the thickness direction (e.g., Z-axis direction).

The gate electrode GE1 of the first transistor ST1 may be a part of the first capacitor electrode CPE1 of the storage capacitor C1. The first capacitor electrode CPE1 may be electrically connected to a sixth connection electrode BE6, and the sixth connection electrode BE6 may be electrically connected to the source electrode SE2 of the second transistor ST2 through a tenth contact hole CNT10.

The drain electrode DE1 and the source electrode SE1 of the first transistor ST1 may be turned into conductors by heat treatment on the material of the active region ACT1. The drain electrode DE1 of the first transistor ST1 may be electrically connected to the eleventh connection electrode BE11 through the seventh contact hole CNT7, and the eleventh connection electrode BE11 may be electrically connected to the driving voltage line VDDL through the twenty-seventh contact holes CNT27. The drain electrode DE1 of the first transistor ST1 may receive the driving voltage from the driving voltage line VDDL.

The source electrode SE1 of the first transistor ST1 may be electrically connected to a fourth connection electrode BE4 through an eighth contact hole CNT8. The fourth connection electrode BE4 may be electrically connected to the second capacitor electrode CPE2 through a twenty-third contact hole CNT23. Accordingly, the storage capacitor C1 may be formed doubly between the first capacitor electrode CPE1 and the second capacitor electrode CPE2 and between the first capacitor electrode CPE1 and the fourth connection electrode BE4.

The fourth connection electrode BE4 may be electrically connected to the source electrode SE3 of the third transistor ST3 through a twelfth contact hole CNT12. The fourth connection electrode BE4 may be electrically connected to the first electrode of the electrode layer through a thirtieth contact hole CNT30.

The second transistor ST2 of the second pixel SP2 may include an active region ACT2, a gate electrode GE2, a drain electrode DE2, and a source electrode SE2. The active region ACT2 of the second transistor ST2 may overlap the gate electrode GE2 of the second transistor ST2 in the thickness direction (e.g., Z-axis direction). The gate electrode GE2 of the second transistor ST2 may be a part of the auxiliary gate line BGL.

The drain electrode DE2 of the second transistor ST2 may be electrically connected to the fifth connection electrode BE5 through the ninth contact hole CNT9, and the fifth connection electrode BE5 may be electrically connected to the second data line DL2 through the twenty-fourth contact hole CNT24. The drain electrode DE2 of the second transistor ST2 may receive the data voltage of the second pixel SP2 from the second data line DL2.

The source electrode SE2 of the second transistor ST2 may be electrically connected to the sixth connection electrode BE6 through the tenth contact hole CNT10. The sixth connection electrode BE6 may be electrically connected to the first capacitor electrode CPE1 to be electrically connected to the gate electrode GE1 of the first transistor ST1.

The third transistor ST3 of the second pixel SP2 may include an active region ACT3, a gate electrode GE3, a drain electrode DE3, and a source electrode SE3. The active region ACT3 of the third transistor ST3 may overlap the gate electrode GE3 thereof in the thickness direction (e.g., Z-axis direction). The gate electrode GE3 of the third transistor ST3 may be a part of the auxiliary gate line BGL.

The drain electrode DE3 of the third transistor ST3 may be electrically connected to the tenth connection electrode BE10 through the eleventh contact hole CNT11. The tenth connection electrode BE10 may be electrically connected to the initialization voltage line VIL through the twentieth contact holes CNT20. The drain electrode DE3 of the third transistor ST3 may receive the initialization voltage from the initialization voltage line VIL. The drain electrode DE3 of the third transistor ST3 may supply the sensing signal to the initialization voltage line VIL.

The source electrode SE3 of the third transistor ST3 may be electrically connected to the fourth connection electrode BE4 through the twelfth contact hole CNT12. The fourth connection electrode BE4 may be electrically connected to the source electrode SE1 of the first transistor ST1 through the eighth contact hole CNT8, electrically connected to the second capacitor electrode CPE2 through the twenty-third contact hole CNT23, and electrically connected to the first electrode of the electrode layer through the thirtieth contact hole CNT30.

The pixel circuit of the third pixel SP3 may include first to third transistors ST1, ST2, and ST3. The first transistor ST1 of the third pixel SP3 may include an active region ACT1, a gate electrode GE1, a drain electrode DE1, and a source electrode SE1. The active region ACT1 of the first transistor ST1 may overlap the gate electrode GE1 of the first transistor ST1 in the thickness direction (e.g., Z-axis direction).

The gate electrode GE1 of the first transistor ST1 may be a part of the first capacitor electrode CPE1 of the storage capacitor C1. The first capacitor electrode CPE1 may be electrically connected to a ninth connection electrode BE9, and the ninth connection electrode BE9 may be electrically connected to the source electrode SE2 of the second transistor ST2 through a sixteenth contact hole CNT16.

The drain electrode DE1 and the source electrode SE1 of the first transistor ST1 may be turned into conductors by heat treatment on the material of the active region ACT1. The drain electrode DE1 of the first transistor ST1 may be electrically connected to the eleventh connection electrode BE11 through the thirteenth contact hole CNT13, and the eleventh connection electrode BE11 may be electrically connected to the driving voltage line VDDL through the twenty-seventh contact holes CNT27. The drain electrode DE1 of the first transistor ST1 may receive the driving voltage from the driving voltage line VDDL.

The source electrode SE1 of the first transistor ST1 may be electrically connected to a seventh connection electrode BE7 through a fourteenth contact hole CNT14. The seventh connection electrode BE7 may be electrically connected to the second capacitor electrode CPE2 through a twenty-fifth contact hole CNT25. Accordingly, the storage capacitor C1 may be formed doubly between the first capacitor electrode CPE1 and the second capacitor electrode CPE2 and between the first capacitor electrode CPE1 and the seventh connection electrode BE7.

The seventh connection electrode BE7 may be electrically connected to the source electrode SE3 of the third transistor ST3 through an eighteenth contact hole CNT18. The seventh connection electrode BE7 may be electrically connected to the first electrode of the electrode layer through a thirty-first contact hole CNT31.

The second transistor ST2 of the third pixel SP3 may include an active region ACT2, a gate electrode GE2, a drain electrode DE2, and a source electrode SE2. The active region ACT2 of the second transistor ST2 may overlap the gate electrode GE2 of the second transistor ST2 in the thickness direction (e.g., Z-axis direction). The gate electrode GE2 of the second transistor ST2 may be a part of the auxiliary gate line BGL.

The drain electrode DE2 of the second transistor ST2 may be electrically connected to the eighth connection electrode BE8 through the fifteenth contact hole CNT15, and the eighth connection electrode BE8 may be electrically connected to the third data line DL3 through the twenty-sixth contact hole CNT26. The drain electrode DE2 of the second transistor ST2 may receive the data voltage of the third pixel SP3 from the third data line DL3.

The source electrode SE2 of the second transistor ST2 may be electrically connected to the ninth connection electrode BE9 through the sixteenth contact hole CNT16. The ninth connection electrode BE9 may be electrically connected to the first capacitor electrode CPE1 to be electrically connected to the gate electrode GE1 of the first transistor ST1.

The third transistor ST3 of the third pixel SP3 may include an active region ACT3, a gate electrode GE3, a drain electrode DE3, and a source electrode SE3. The active region ACT3 of the third transistor ST3 may overlap the gate electrode GE3 of the third transistor ST3 in the thickness direction (e.g., Z-axis direction). The gate electrode GE3 of the third transistor ST3 may be a part of the auxiliary gate line BGL.

The drain electrode DE3 of the third transistor ST3 may be electrically connected to the tenth connection electrode BE10 through the seventeenth contact hole CNT17. The tenth connection electrode BE10 may be electrically connected to the initialization voltage line VIL through the twentieth contact holes CNT20. The drain electrode DE3 of the third transistor ST3 may receive the initialization voltage from the initialization voltage line VIL. The drain electrode DE3 of the third transistor ST3 may supply the sensing signal to the initialization voltage line VIL.

The source electrode SE3 of the third transistor ST3 may be electrically connected to the seventh connection electrode BE7 through the eighteenth contact hole CNT18. The seventh connection electrode BE7 may be electrically connected to the source electrode SE1 of the first transistor ST1 through the fourteenth contact hole CNT14, electrically connected to the second capacitor electrode CPE2 through the twenty-fifth contact hole CNT25, and electrically connected to the first electrode of the electrode layer through the thirty-first contact hole CNT31.

Figure 7:
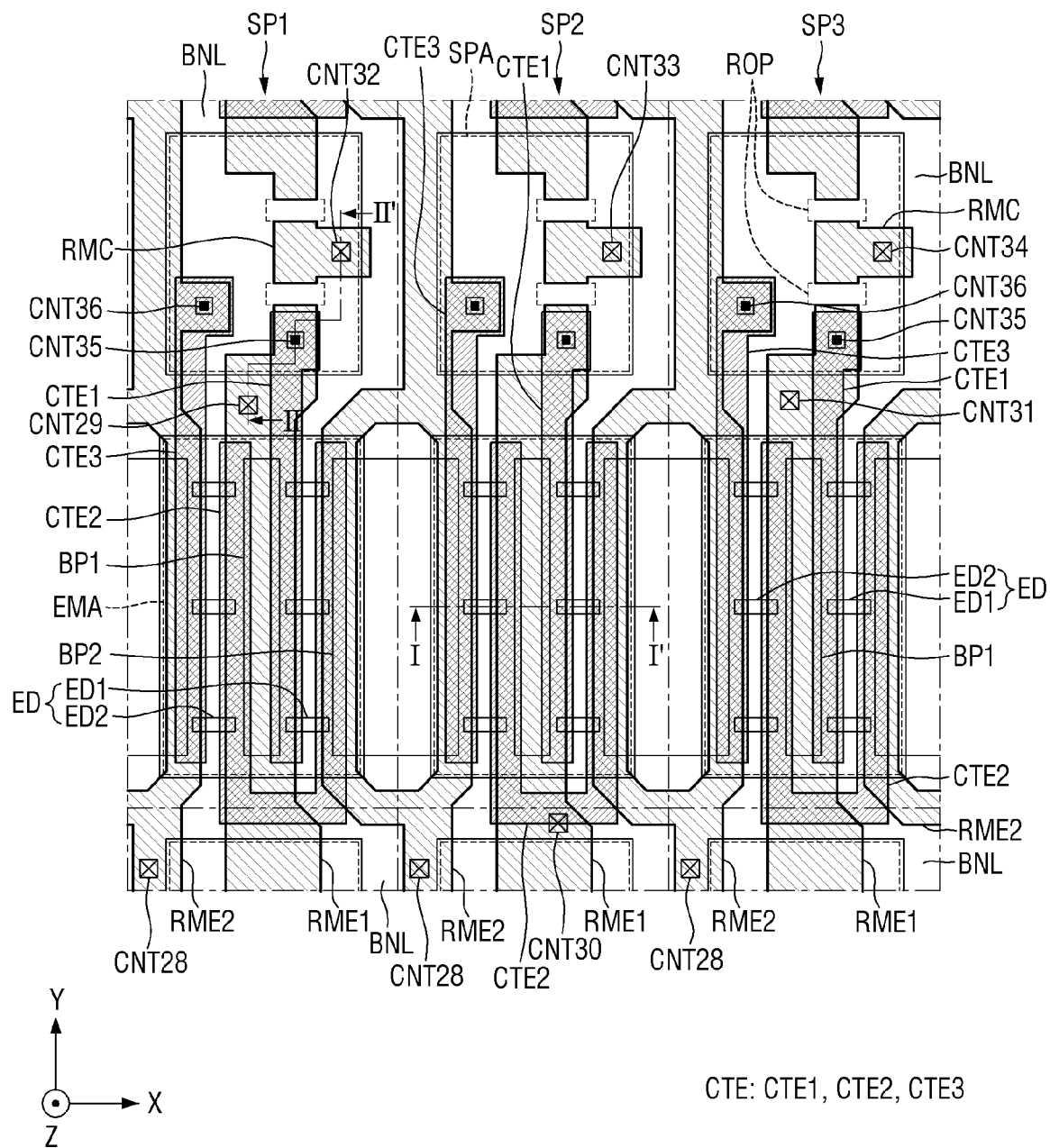
FIG. 7 is a schematic plan view illustrating a light emitting element layer of a display device according to an embodiment.
Figure 8:
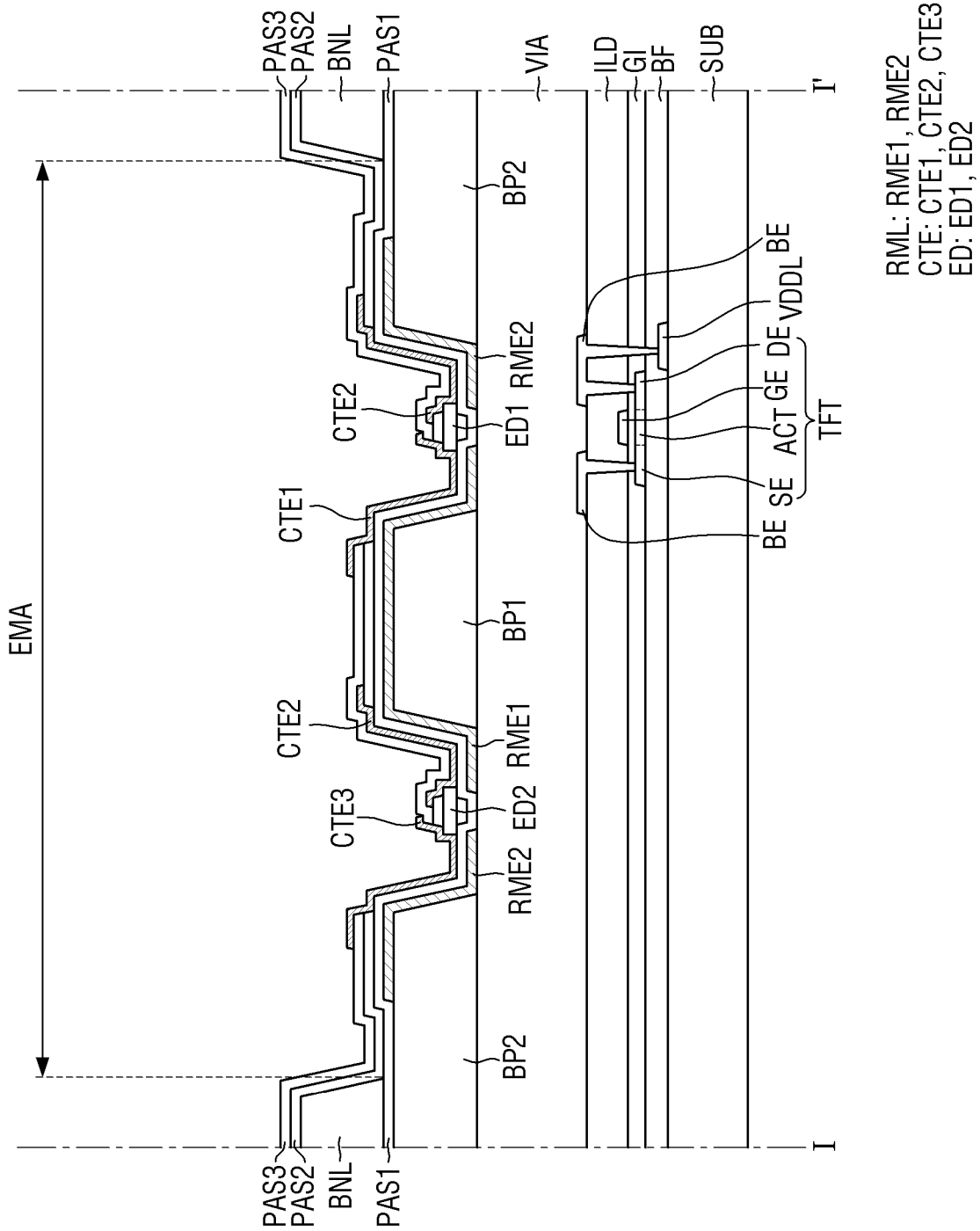
FIG. 8 is a schematic cross-sectional view taken along line I-I' of FIG. 7.
Figure 9:
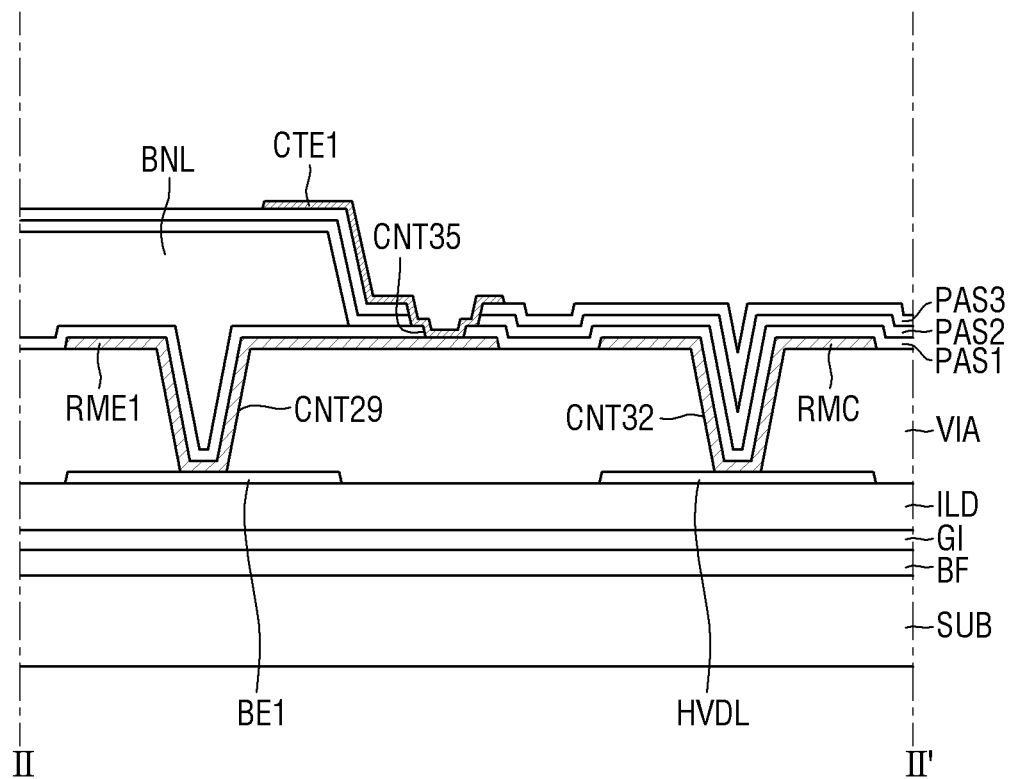
FIG. 9 is a schematic cross-sectional view taken along line II-II' of FIG. 7.

FIG. 7 is a schematic plan view illustrating a light emitting element layer of a display device according to an embodiment, FIG. 8 is a schematic cross-sectional view taken along line I-I' of FIG. 7, and FIG. 9 is a schematic cross-sectional view taken along line II-II' of FIG. 7.

Referring to FIGS. 7 to 9, the light emitting element layer of a display device may include a substrate SUB, first and second bank patterns BP1 and BP2, first and second electrodes RME1 and RME2, a first insulating layer PAS1, a bank layer BNL, a second insulating layer PAS2, first to third contact electrodes CTE1, CTE2, and CTE3, and a third insulating layer PAS3.

The first bank pattern BP1 may be disposed at a central portion of an emission area EMA, and the second bank patterns BP2 may be spaced apart from each other with the first bank pattern BP1 therebetween. The first and second bank patterns BP1 and BP2 may be arranged alternately in the first direction (e.g., X-axis direction). The light emitting elements ED may be disposed in spaces separated between the first and second banks BP1 and BP2.

The first bank pattern BP1 and the second bank pattern BP2 may have a same length in the second direction (e.g., Y-axis direction) and different lengths in the first direction (e.g., X-axis direction). An area of the bank layer BNL extending in the second direction (e.g., Y-axis direction) may overlap the second bank pattern BP2 in the thickness direction. The first and second bank patterns BP1 and BP2 may be disposed in island-like patterns on the entire surface of the display area DA.

The first and second electrodes RME1 and RME2 of each of the first to third pixels SP1, SP2, and SP3 may be disposed in an electrode layer RML. The first electrode RME1 of the first pixel SP1 may extend in the second direction (e.g., Y-axis direction) at the center of the pixel area. The second electrode RME2 of the first pixel SP1 may extend in the second direction (e.g., Y-axis direction) on left and right sides of the pixel area. The first electrode RME1 of the second pixel SP2 may extend in the second direction (e.g., Y-axis direction) at the center of the pixel area. The second electrode RME2 of the second pixel SP2 may extend in the second direction (e.g., Y-axis direction) on the left and right sides of the pixel area. The first electrode RME1 of the third pixel SP3 may extend in the second direction (e.g., Y-axis direction) at the center of the pixel area. The second electrode RME2 of the third pixel SP3 may extend in the second direction (e.g., Y-axis direction) on the left and right sides of the pixel area. The second electrode RME2 disposed on the right side of the first pixel SP1 may be formed integrally with (or integral with) the second electrode RME2 disposed on the left side of the second pixel SP2. The second electrode RME2 disposed on the right side of the second pixel SP2 may be integral with the second electrode RME2 disposed on the left side of the third pixel SP3.

One end of the first electrode RME1 of each of the first to third pixels SP1, SP2, and SP3 may be separated from an alignment electrode RMC by a separation portion ROP. The alignment electrode RMC refers to a portion electrically connected to the horizontal driving voltage line HVDL through thirty-second to thirty-fourth contact holes CNT32, CNT33 and CNT34, and the alignment electrode RMC and the first electrode RME1 may be electrically connected to each other during the alignment of the light emitting elements ED. The alignment electrode RMC and the first electrode RME1 may be separated by the separation portion ROP after the alignment of the light emitting elements ED is completed.

First light emitting elements ED1 may be aligned between the first electrode RME1 and the second electrode RME2 on the right. The first insulating layer PAS1 may cover the first and second electrodes RME1 and RME2. The first light emitting elements ED1 may be insulated from the first and second electrodes RME1 and RME2 by the first insulating layer PAS1. Before the first electrode RME1 and the alignment electrode RMC are separated by the separation portion ROP, each of the first and second electrodes RME1 and RME2 may receive an alignment signal, and an electric field may be formed between the first and second electrodes RME1 and RME2. For example, the first light emitting elements ED1 may be sprayed on the first and second electrodes RME1 and RME2 by an inkjet printing process, and the first light emitting elements ED1 dispersed in ink may be aligned by a dielectrophoretic force due to the electric field formed between the first and second electrodes RME1 and RME2.

Second light emitting elements ED2 may be aligned between the first electrode RME1 and the second electrode RME2 on the left thereof. Before the first electrode RME1 and the alignment electrode RMC are separated by the separation portion ROP, each of the first and second electrodes RME1 and RME2 may receive the alignment signal, and the electric field may be formed between the first and second electrodes RME1 and RME2. For example, the second light emitting elements ED2 may be sprayed on the first and second electrodes RME1 and RME2 by an inkjet printing process, and the second light emitting elements ED2 dispersed in ink may be aligned by a dielectrophoretic force due to the electric field formed between the first and second electrodes RME1 and RME2.

The first electrode RME1 of the first pixel SP1 may be electrically connected to the first connection electrode BE1 of the pixel circuit through the twenty-ninth contact hole CNT29. The first electrode RME1 may receive the driving current having passed through the first transistor ST1 from the first connection electrode BE1. The first electrode RME1 may supply the driving current to the first light emitting elements ED1 of the first pixel SP1.

The second electrode RME2 of the first pixel SP1 may be electrically connected to the horizontal low-potential line HVSL of the pixel circuit through the twenty-eighth contact hole CNT28. Accordingly, the second electrode RME2 of the first pixel SP1 may receive the low-potential voltage from the horizontal low-potential line HVSL.

The first electrode RME1 of the second pixel SP2 may be electrically connected to the fourth connection electrode BE4 of the pixel circuit through the thirtieth contact hole CNT30. The first electrode RME1 may receive the driving current having passed through the first transistor ST1 from the fourth connection electrode BE4. The first electrode RME1 may supply the driving current to the first light emitting elements ED1 of the second pixel SP2.

The second electrode RME2 of the second pixel SP2 may be electrically connected to the horizontal low-potential line HVSL of the pixel circuit through the twenty-eighth contact hole CNT28. Accordingly, the second electrode RME2 of the second pixel SP2 may receive the low-potential voltage from the horizontal low-potential line HVSL.

The first electrode RME1 of the third pixel SP3 may be electrically connected to the seventh connection electrode BE7 of the pixel circuit through the thirty-first contact hole CNT31. The first electrode RME1 may receive the driving current having passed through the first transistor ST1 from the seventh connection electrode BE7. The first electrode RME1 may supply the driving current to the first light emitting elements ED1 of the third pixel SP3.

The second electrode RME2 of the third pixel SP3 may be electrically connected to the horizontal low-potential line HVSL of the pixel circuit through the twenty-eighth contact hole CNT28. Accordingly, the second electrode RME2 of the third pixel SP3 may receive the low-potential voltage from the horizontal low-potential line HVSL.

The first to third contact electrodes CTE1, CTE2, and CTE3 of each of the first to third pixels SP1, SP2, and SP3 may be disposed on the first and second electrodes RME1 and RME2. The second insulating layer PAS2 may be disposed on the bank layer BNL, the first insulating layer PAS1, and central portions of the light emitting elements ED. The third insulating layer PAS3 may cover the second contact electrode CTE2. The second and third insulating layers PAS2 and PAS3 may insulate the first and second contact electrodes CTE1 and CTE2, and may insulate the second and third contact electrodes CTE2 and CTE3.

The first contact electrode CTE1 may be disposed on the first electrode RME1 and electrically connected to the first electrode RME1 through a thirty-fifth contact hole CNT35. The first contact electrode CTE1 may be electrically connected between the first electrode RME1 and the first light emitting elements ED1. The first contact electrode CTE1 may correspond to an anode electrode of the first light emitting elements ED1, but the disclosure is not limited thereto.

The second contact electrode CTE2 may be disposed on the first and second electrodes RME1 and RME2 and be insulated from the first and second electrodes RME1 and RME2. A first portion of the second contact electrode CTE2 may be disposed on the second electrode RME2 on the right thereof and extend in the second direction (e.g., Y-axis direction). A second portion of the second contact electrode CTE2 may be bent from a lower side of the first portion thereof to extend in the opposite direction of the first direction (e.g., X-axis direction). A third portion of the second contact electrode CTE2 may be bent from a left side of the second portion thereof to extend in the second direction (e.g., Y-axis direction) and may be disposed on the first electrode RME1.

The second contact electrode CTE2 may be electrically connected between the first light emitting elements ED1 and the second light emitting elements ED2. The second contact electrode CTE2 may correspond to a cathode electrode of the first light emitting elements ED1, but the disclosure is not limited thereto. The second contact electrode CTE2 may correspond to an anode electrode of the second light emitting elements ED2, but the disclosure is not limited thereto.

The third contact electrode CTE3 may be disposed on the second electrode RME2 on the left thereof and may be electrically connected to the second electrode RME2 through a thirty-sixth contact hole CNT36. The third contact electrode CTE3 may be electrically connected between the second light emitting elements ED2 and the second electrode RME2. The third contact electrode CTE3 may correspond to a cathode electrode of the second light emitting elements ED2, but the disclosure is not limited thereto. The third contact electrode CTE3 may receive the low-potential voltage through the second electrode RME2.

As another example, the first contact electrode CTE1 may be directly electrically connected to the first connection electrode BE2 of the pixel circuit, and the third contact electrode CTE3 may be directly electrically connected to the horizontal low-potential line HVSL of the pixel circuit.

A thin-film transistor TFT may include an active area ACT, a gate electrode GE, a drain electrode DE, and a source electrode SE. The drain electrode DE of the thin-film transistor TFT may receive the voltage from a first voltage line (or driving voltage line VDDL) through a connection electrode BE. The source electrode SE of the thin-film transistor TFT may be electrically connected to the first electrodes RME1 of the first to third pixels SP1, SP2, and SP3 through the connection electrode BE. The thin-film transistor TFT may constitute the pixel circuit of each of the first to third pixels SP1, SP2, and SP3.

Figure 10:
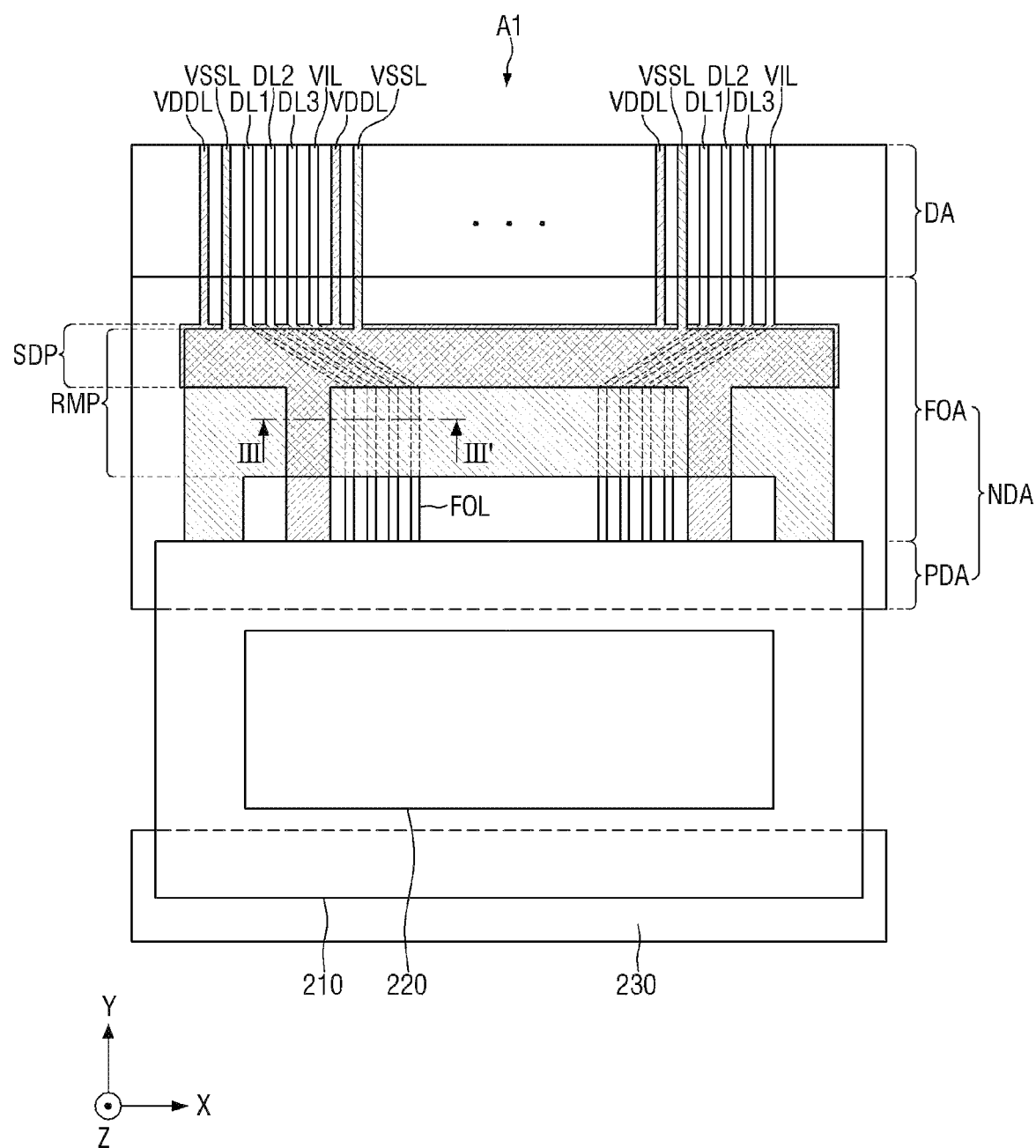
FIG. 10 is a schematic enlarged view of an example of area A1 of FIG. 2.
Figure 11:
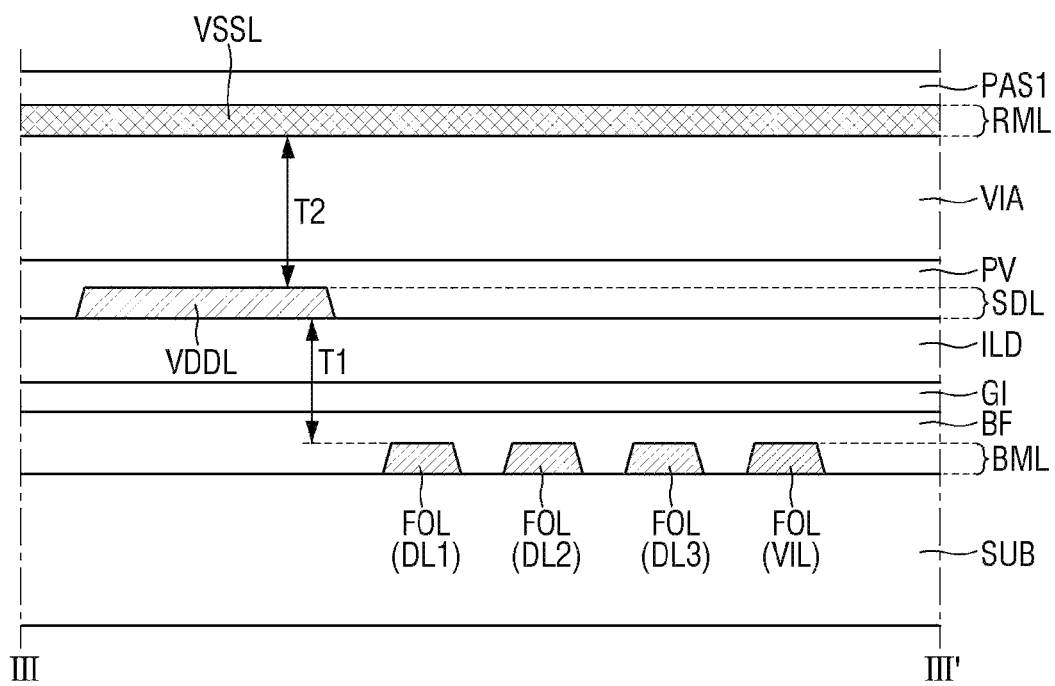
FIG. 11 is a schematic cross-sectional view taken along line of FIG. 10.

FIG. 10 is a schematic enlarged view of an example of area A1 of FIG. 2, and FIG. 11 is a schematic cross-sectional view taken along line of FIG. 10.

Referring to FIGS. 10 and 11, the non-display area NDA may include a pad area PDA and the fan-out area FOA. The pad area PDA and the fan-out area FOA may be disposed on a side of the non-display area NDA. The pad area PDA may include pad portions electrically connected to the flexible film 210. The display driver 220 may be mounted on the flexible film 210, and the flexible film 210 may be attached to the pad portions of the pad area PDA. The flexible film 210 may include a signal line that electrically connects the display driver 220 to the pad portions.

The fan-out area FOA may be disposed between the pad area PDA and the display area DA. The fan-out area FOA may include the fan-out lines FOL. The fan-out lines FOL may electrically connect the data lines DL to the display driver 220 and electrically connect the initialization voltage line VIL to the display driver 220. In the fan-out area FOA, the fan-out lines FOL may be disposed in a metal layer BML. The fan-out lines FOL may be bent at least once to extend from the pad portions to the display area DA. For example, the fan-out lines FOL may be formed as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof.

The driving voltage line VDDL may be disposed between the pad area PDA and the display area DA. In the fan-out area FOA, the driving voltage line VDDL may be disposed in a source-drain layer SDL. For example, the driving voltage line VDDL may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

The driving voltage line VDDL may include a first plate portion SDP disposed in the fan-out area FOA. The first plate portion SDP of the driving voltage line VDDL may overlap the fan-out lines FOL in the thickness direction. The driving voltage line VDDL may extend in the fan-out area FOA through the source-drain layer SDL and extend in the display area DA through the metal layer BML. Driving voltage lines VDDL may be branched off from the first plate portion SDP to extend into the display area DA. For example, the driving voltage lines VDDL extending into the display area DA may be spaced apart from each other with the first to third data lines DL1, DL2, and DL3 therebetween.

For example, a distance T1 between the source-drain layer SDL and the metal layer BML may be equal to or larger (or greater) than 10,000 angstroms (Å). A buffer layer BF, a gate insulating layer GI, and an interlayer insulating layer ILD may be disposed between the metal layer BML and the source-drain layer SDL. Accordingly, the sum (T1) of the thicknesses of the buffer layer BF, the gate insulating layer GI, and the interlayer insulating layer ILD may be equal to or greater than 10,000 angstroms (Å). Accordingly, the display device may prevent a risk of a short circuit between the fan-out line FOL and the driving voltage line VDDL.

By including the first plate portion SDP, the driving voltage line VDDL may reduce the size of the fan-out area FOA while reducing the internal resistance of the driving voltage line VDDL. By including the first plate portion SDP, the driving voltage line VDDL may reduce signal interference due to coupling capacitance of the fan-out lines FOL.

The low-potential line VSSL may be disposed between the pad area PDA and the display area DA. In the fan-out area FOA, the low-potential line VSSL may be disposed in the electrode layer RML. For example, the low-potential line VSSL may contain at least one of silver (Ag), copper (Cu), aluminum (Al), nickel (Ni), or lanthanum (La). For another example, the low-potential line VSSL may include a material such as ITO, IZO, and ITZO. As still another example, the low-potential line VSSL may include a transparent conductive material layer and a metal layer with high reflectivity, or include a single layer containing a transparent conductive material and a metal with high reflectivity. The low-potential line VSSL may have a stacked structure of ITO/Ag/ITO, ITO/Ag/IZO, or ITO/Ag/ITZO/IZO.

The low-potential line VSSL may include a second plate portion RMP disposed in the fan-out area FOA. The second plate portion RMP of the low-potential line VSSL may overlap the first plate portion SDP and the fan-out lines FOL in the thickness direction. The low-potential line VSSL may extend in the fan-out area FOA through the electrode layer RML and extend in the display area DA through the metal layer BML. Low-potential lines VSSL may be branched off from the second plate portion RMP to extend into the display area DA. For example, the low-potential lines VSSL extending into the display area DA may be spaced apart from each other with the first to third data lines DL1, DL2, and DL3 therebetween.

For example, the area of the second plate portion RMP may be greater than the area of the first plate portion SDP. Further, the width of the low-potential line VSSL may be greater than the width of the driving voltage line VDDL. Accordingly, even if the resistance of the material forming the second plate portion RMP is greater than the resistance of the material forming the first plate portion SDP, since the second plate portion RMP has a relatively large area, the internal resistance of the second plate portion RMP may be reduced.

For example, a distance T2 between the electrode layer RML and the source-drain layer SDL may be equal to or greater than 10,000 angstroms (Å). A passivation layer PV and a via layer VIA may be disposed between the electrode layer RML and the source-drain layer SDL. Accordingly, the sum (T2) of the thicknesses of the passivation layer PV and the via layer VIA may be equal to or greater than 10,000 angstroms (Å). Accordingly, the display device may prevent a risk of a short circuit between the driving voltage line VDDL and the low-potential line VSSL.

By including the second plate portion RMP, the low-potential line VSSL may protect multiple lines disposed under the electrode layer RML from static electricity. The low-potential line VSSL may prevent static electricity from reaching the source-drain layer SDL or the metal layer BML through the second plate portion RMP, or reaching the inside of the display area DA. Further, by including the second plate portion RMP, the low-potential line VSSL may reduce the size of the fan-out area FOA while reducing the internal resistance of the low-potential line VSSL. By including the second plate portion RMP, the low-potential line VSSL may reduce signal interference due to coupling capacitance of the fan-out lines FOL.

Figure 12:
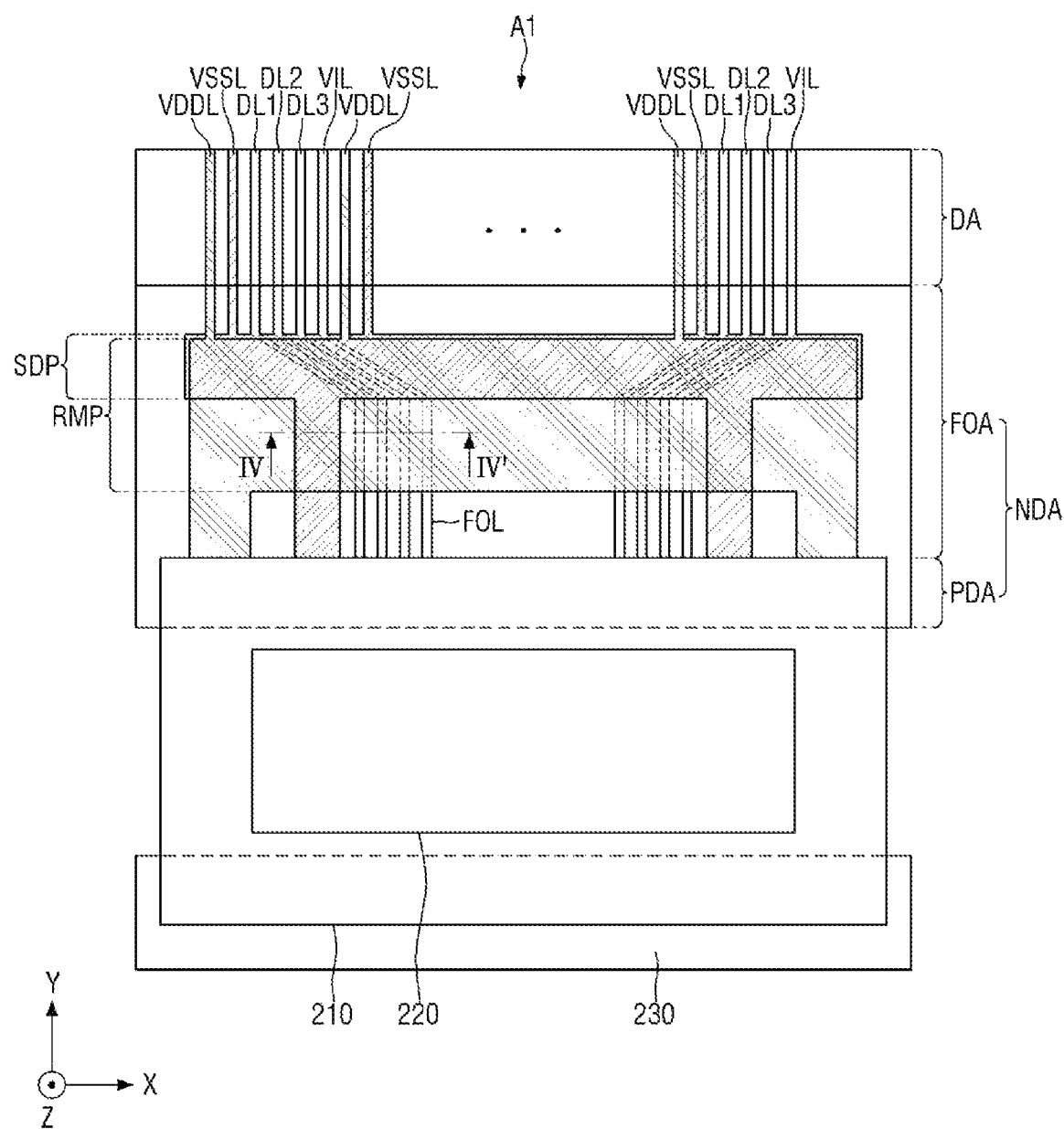
FIG. 12 is a schematic enlarged view of another example of area A1 of FIG. 2.
Figure 13:
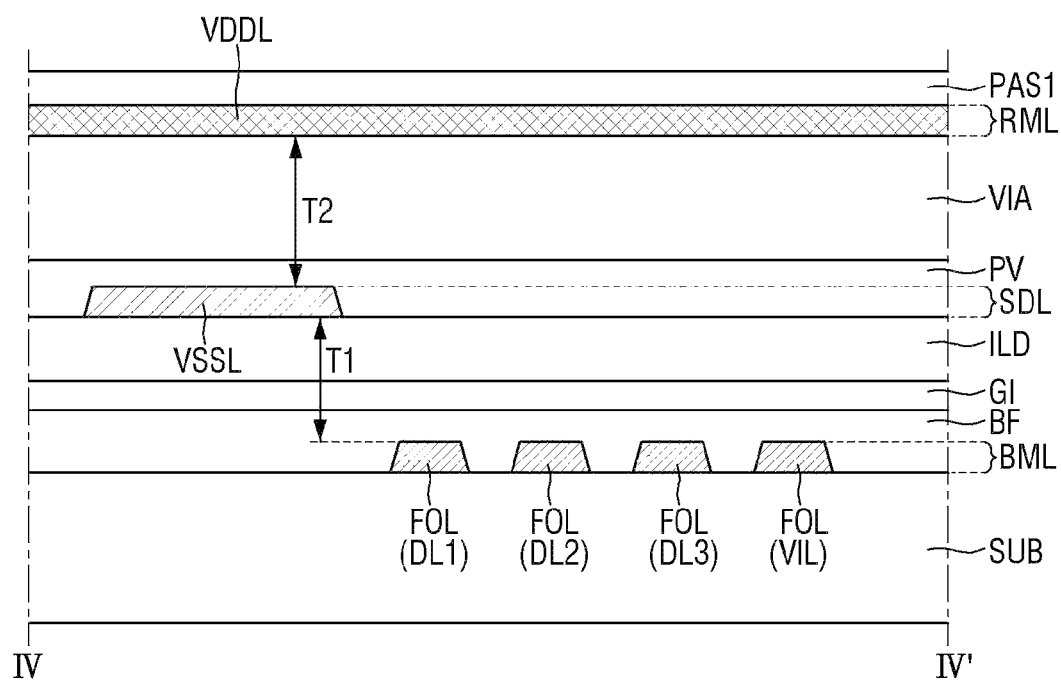
FIG. 13 is a schematic cross-sectional view taken along line IV-IV' of FIG. 12.

FIG. 12 is a schematic enlarged view of another example of area A1 of FIG. 2, and FIG. 13 is a schematic cross-sectional view taken along line IV-IV' of FIG. 12.

Referring to FIGS. 12 and 13, the fan-out area FOA may be disposed between the pad area PDA and the display area DA. The fan-out area FOA may include the fan-out lines FOL. The fan-out lines FOA may electrically connect the data lines DL to the display driver 220 and electrically connect the initialization voltage line VIL to the display driver 220. In the fan-out area FOA, the fan-out lines FOL may be disposed in the metal layer BML. The fan-out lines FOL may be bent at least once to extend from the pad portions to the display area DA. For example, the fan-out lines FOL may be formed as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof.

The low-potential line VSSL may be disposed between the pad area PDA and the display area DA. In the fan-out area FOA, the low-potential line VSSL may be disposed in the source-drain layer SDL. For example, the low-potential line VSSL may be formed as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof.

The low-potential line VSSL may include the first plate portion SDP disposed in the fan-out area FOA. The first plate portion SDP of the low-potential line VSSL may overlap the fan-out lines FOL in the thickness direction. The low-potential line VSSL may extend in the fan-out area FOA through the source-drain layer SDL and extend in the display area DA through the metal layer BML. The low-potential lines VSSL may be branched off from the first plate portion SDP to extend into the display area DA. For example, the low-potential lines VSSL extending into the display area DA may be spaced apart from each other with the first to third data lines DL1, DL2, and DL3 therebetween.

For example, the distance T1 between the source-drain layer SDL and the metal layer BML may be equal to or greater than 10,000 angstroms (Å). A buffer layer BF, a gate insulating layer GI, and an interlayer insulating layer ILD may be disposed between the metal layer BML and the source-drain layer SDL. Accordingly, the sum (T1) of the thicknesses of the buffer layer BF, the gate insulating layer GI, and the interlayer insulating layer ILD may be equal to or greater than 10,000 angstroms (Å). Accordingly, the display device may prevent a risk of a short circuit between the fan-out line FOL and the low-potential line VSSL.

By including the first plate portion SDP, the low-potential line VSSL may reduce the size of the fan-out area FOA while reducing the internal resistance of the low-potential line VSSL. By including the first plate portion SDP, the low-potential line VSSL may reduce signal interference due to coupling capacitance of the fan-out lines FOL.

The driving voltage line VDDL may be disposed between the pad area PDA and the display area DA. In the fan-out area FOA, the driving voltage line VDDL may be disposed in the electrode layer RML. For example, the driving voltage line VDDL may contain at least one of silver (Ag), copper (Cu), aluminum (Al), nickel (Ni), or lanthanum (La). For another example, the driving voltage line VDDL may include a material such as ITO, IZO, and ITZO. As still another example, the driving voltage line VDDL may include a transparent conductive material layer and a metal layer with high reflectivity, or include a single layer containing a transparent conductive material and a metal with high reflectivity. The driving voltage line VDDL may have a stacked structure of ITO/Ag/ITO, ITO/Ag/IZO, ITO/Ag/ITZO/IZO, or the like.

The driving voltage line VDDL may include the second plate portion RMP disposed in the fan-out area FOA. The second plate portion RMP of the driving voltage line VDDL may overlap the first plate portion SDP and the fan-out lines FOL in the thickness direction. The driving voltage line VDDL may extend in the fan-out area FOA through the electrode layer RML and extend in the display area DA through the metal layer BML. The driving voltage lines VDDL may be branched off from the second plate portion RMP to extend into the display area DA. For example, the driving voltage lines VDDL extending into the display area DA may be spaced apart from each other with the first to third data lines DL1, DL2, and DL3 therebetween.

For example, the area of the second plate portion RMP may be greater than the area of the first plate portion SDP. Further, the width of the driving voltage line VDDL may be greater than the width of the low-potential voltage line VSSL. Accordingly, even if the resistance of the material forming the second plate portion RMP is greater than the resistance of the material forming the first plate portion SDP, since the second plate portion RMP has a relatively large area, the internal resistance of the second plate portion RMP may be reduced.

For example, the distance T2 between the electrode layer RML and the source-drain layer SDL may be equal to or greater than 10,000 angstroms (Å). A passivation layer PV and a via layer VIA may be disposed between the electrode layer RML and the source-drain layer SDL. Accordingly, the sum (T2) of the thicknesses of the passivation layer PV and the via layer VIA may be equal to or greater than 10,000 angstroms (Å). Accordingly, the display device may prevent a risk of a short circuit between the low-potential line VSSL and the driving voltage line VDDL.

By including the second plate portion RMP, the driving voltage line VDDL may protect the multiple lines disposed under the electrode layer RML from static electricity. The driving voltage line VDDL may prevent static electricity from reaching the source-drain layer SDL or the metal layer BML through the second plate portion RMP, or reaching the inside of the display area DA. Further, by including the second plate portion RMP, the driving voltage line VDDL may reduce the size of the fan-out area FOA while reducing the internal resistance of the driving voltage line VDDL. By including the second plate portion RMP, the driving voltage line VDDL may reduce signal interference due to coupling capacitance of the fan-out lines FOL.

Figure 14:
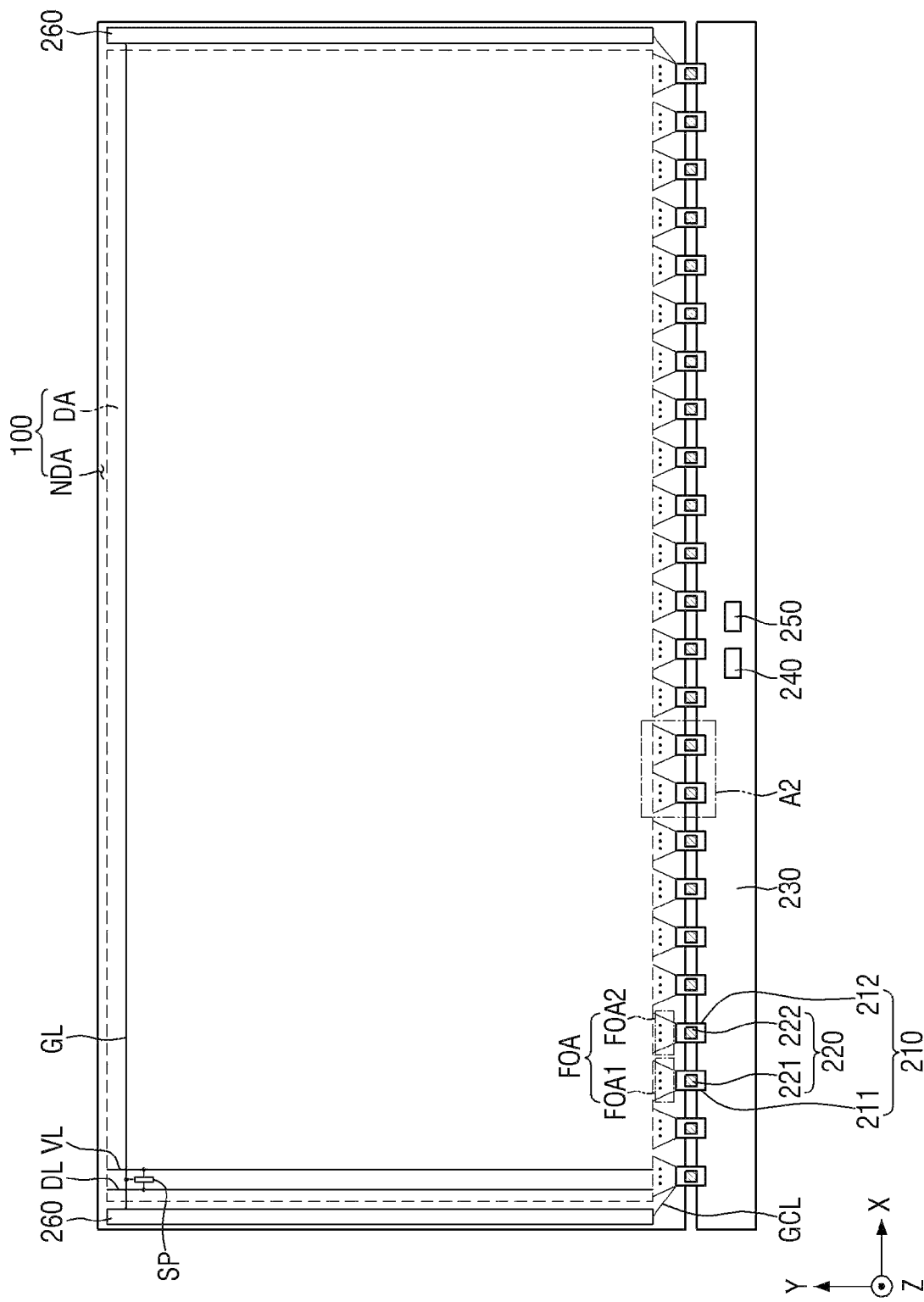
FIG. 14 is a schematic plan view illustrating a display device according to another embodiment.
Figure 15:
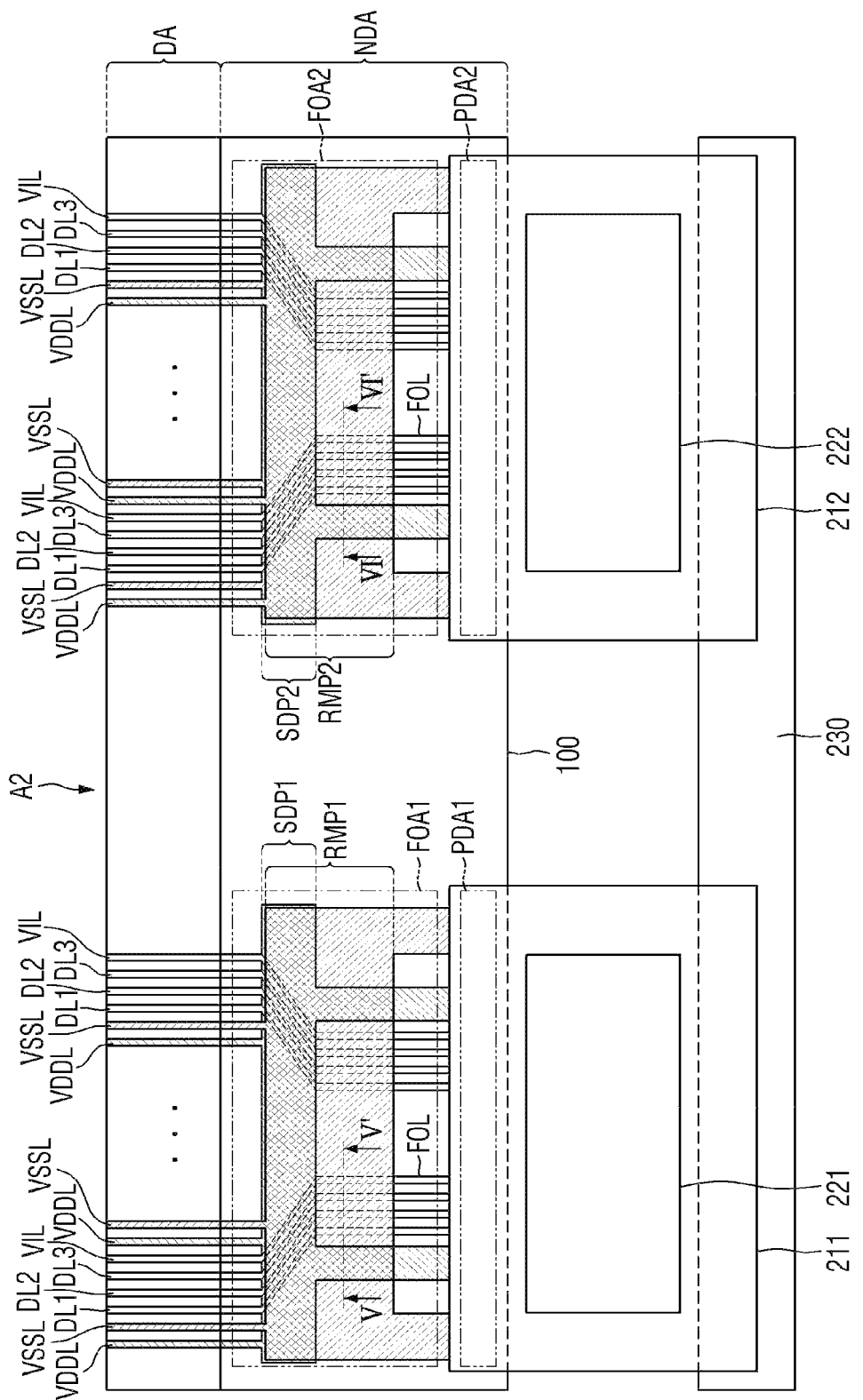
FIG. 15 is a schematic enlarged view of area A2 of FIG. 14.
Figure 16:
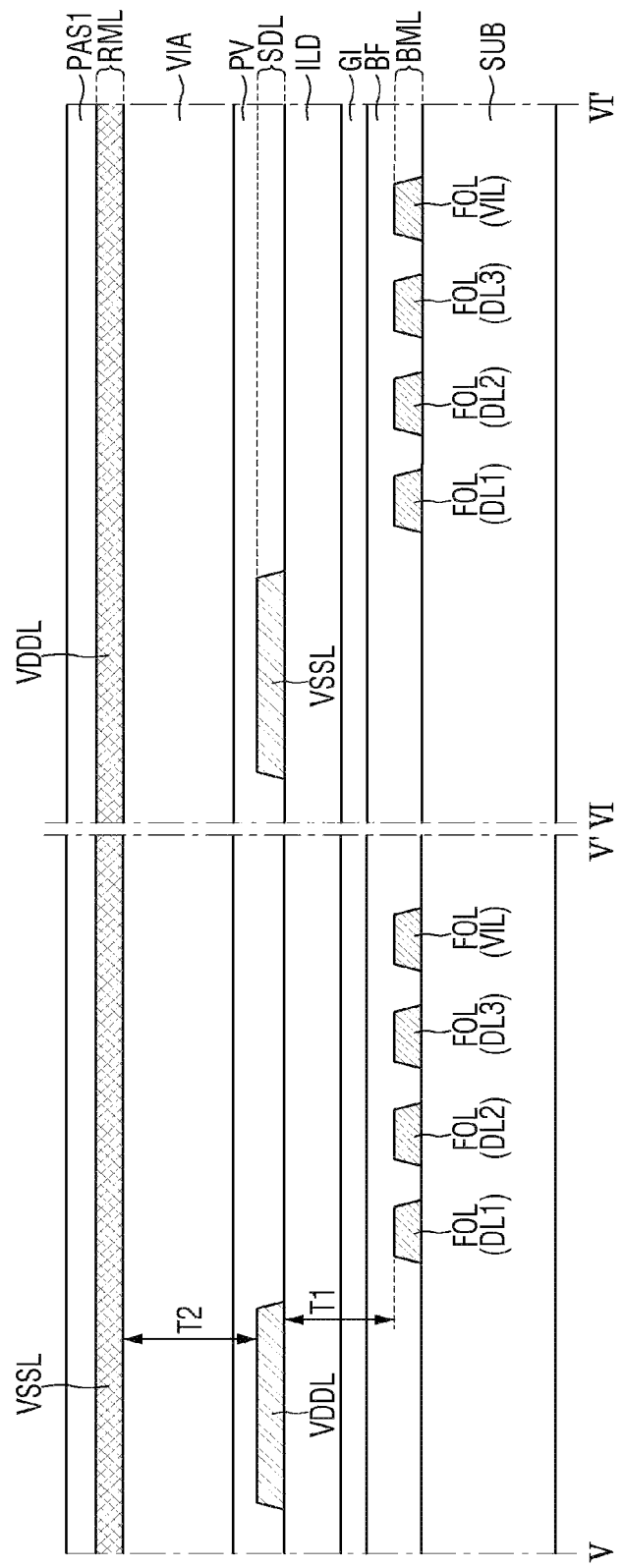
FIG. 16 is a schematic cross-sectional view taken along lines V-V' and VI-VI' of FIG. 15.

FIG. 14 is a schematic plan view illustrating a display device according to another embodiment, FIG. 15 is a schematic enlarged view of area A2 of FIG. 14, and FIG. 16 is a schematic cross-sectional view taken along lines V-V' and VI-VI' of FIG. 15.

Referring to FIGS. 14 to 16, the display device may include the display panel 100, the flexible film 210, the display driver 220, the circuit board 230, the timing controller 240, the power supply part 250, and the gate driver 260. The flexible film 210 may include first and second flexible films 211 and 212, and the display driver 220 may include first and second display drivers 221 and 222. The first display driver 221 may be mounted on the flexible film 211, and the second display driver 222 may be mounted on the second flexible film 212. The first and second flexible films 211 and 212 or the first and second display drivers 221 and 222 may be arranged alternately, but the disclosure is not limited thereto.

The non-display area NDA may include first and second pad areas PDA1 and PDA2 and first and second fan-out areas FOA1 and FOA2. The first pad area PDA1 and the first fan-out area FOA1 may correspond to the first flexible film 211 and the first display driver 221, while the second pad area PDA2 and the second fan-out area FOA2 may correspond to the second flexible film 212 and the second display driver 222. The first and second fan-out areas FOA1 and FOA2 may be alternately arranged on a side of the display area DA, but the disclosure is not limited thereto.

The first and second pad areas PDA1 and PDA2 and the first and second fan-out areas FOA1 and FOA2 may be disposed on a side of the non-display area NDA. The first pad area PDA1 may include pad portions electrically connected to the first flexible film 211, and the second pad area PDA2 may include pad portions electrically connected to the second flexible film 212.

The first fan-out area FOA1 may be disposed between the first pad area PDA1 and the display area DA. The first fan-out area FOA1 may include the fan-out lines FOL. The fan-out lines FOL may electrically connect the data lines DL to the first display driver 221 and electrically connect the initialization voltage line VIL to the first display driver 221. In the first fan-out area FOA1, the fan-out lines FOL may be disposed in the metal layer BML. The fan-out lines FOL may be bent at least once to extend from the pad portions to the display area DA.

The driving voltage line VDDL may be disposed between the first pad area PDA1 and the display area DA. In the first fan-out area FOA1, the driving voltage line VDDL may be disposed in the source-drain layer SDL. The driving voltage line VDDL may include a first source plate portion SDP1 disposed in the first fan-out area FOAL The first source plate portion SDP1 of the driving voltage line VDDL may overlap the fan-out lines FOL in the thickness direction. The driving voltage line VDDL may extend in the first fan-out area FOA1 through the source-drain layer SDL and extend in the display area DA through the metal layer BML. The driving voltage lines VDDL may be branched off from the first source plate portion SDP1 to extend into the display area DA.

For example, the distance T1 between the source-drain layer SDL and the metal layer BML may be equal to or greater than 10,000 angstroms (Å). A buffer layer BF, a gate insulating layer GI, and an interlayer insulating layer ILD may be disposed between the metal layer BML and the source-drain layer SDL. Accordingly, the sum (T1) of the thicknesses of the buffer layer BF, the gate insulating layer GI, and the interlayer insulating layer ILD may be equal to or greater than 10,000 angstroms (Å). Accordingly, the display device may prevent a risk of a short circuit between the fan-out line FOL and the driving voltage line VDDL.

The low-potential line VSSL may be disposed between the first pad area PDA1 and the display area DA. In the first fan-out area FOA1, the low-potential line VSSL may be disposed in the electrode layer RML. The low-potential line VSSL may include a first electrode plate portion RMP1 disposed in the first fan-out area FOAL The first electrode plate portion RMP1 of the low-potential line VSSL may overlap the first source plate portion SDP1 and the fan-out lines FOL in the thickness direction. The low-potential line VSSL may extend in the first fan-out area FOA1 through the electrode layer RML and extend in the display area DA through the metal layer BML. The low-potential lines VSSL may be branched off from the first electrode plate RMP1 to extend into the display area DA.

For example, the area of the first electrode plate portion RMP1 may be greater than the area of the first source plate portion SDP1. Accordingly, even if the resistance of the material forming the first electrode plate portion RMP1 is greater than the resistance of the material forming the first source plate portion SDP1, since the first electrode plate portion RMP1 has a relatively large area, the internal resistance of the first electrode plate portion RMP1 may be reduced.

For example, the distance T2 between the electrode layer RML and the source-drain layer SDL may be equal to or greater than 10,000 angstroms (Å). A passivation layer PV and a via layer VIA may be disposed between the electrode layer RML and the source-drain layer SDL. Accordingly, the sum (T2) of the thicknesses of the passivation layer PV and the via layer VIA may be equal to or greater than 10,000 angstroms (Å). Accordingly, the display device may prevent a risk of a short circuit between the driving voltage line VDDL and the low-potential line VSSL.

The second fan-out area FOA2 may be disposed between the second pad area PDA2 and the display area DA. The second fan-out area FOA2 may include the fan-out lines FOL. The fan-out lines FOL may electrically connect the data lines DL to the second display driver 222 and electrically connect the initialization voltage line VIL to the second display driver 222. In the second fan-out area FOA2, the fan-out lines FOL may be disposed in the metal layer BML. The fan-out lines FOL may be bend at least once to extend from the pad portions to the display area DA.

The low-potential line VSSL may be disposed between the second pad area PDA2 and the display area DA. In the second fan-out area FOA2, the low-potential line VSSL may be disposed in the source-drain layer SDL. The low-potential line VSSL may include a second source plate portion SDP2 disposed in the second fan-out area FOA2. The second source plate portion SDP2 of the low-potential line VSSL may overlap the fan-out lines FOL in the thickness direction. The low-potential line VSSL may extend in the second fan-out area FOA2 through the source-drain layer SDL and extend in the display area DA through the metal layer BML. The low-potential lines VSSL may be branded off from the second source plate portion SDP2 to extend into the display area DA.

The driving voltage line VDDL may be disposed between the second pad area PDA2 and the display area DA. In the second fan-out area FOA2, the driving voltage line VDDL may be disposed in the electrode layer RML. The driving voltage line VDDL may include a second electrode plate portion RMP2 disposed in the second fan-out area FOA2. The second electrode plate portion RMP2 of the driving voltage line VDDL may overlap the second source plate portion SDP2 and the fan-out lines FOL in the thickness direction. The driving voltage line VDDL may extend in the second fan-out area FOA2 through the electrode layer RML and extend in the display area DA through the metal layer BML. The driving voltage lines VDDL may be branched off from the second electrode plate portion RMP2 to extend into the display area DA.

Accordingly, by including the first source plate portion SDP1 in the first fan-out area FOA1 and the second electrode plate portion RMP2 in the second fan-out area FOA2, the driving voltage line VDDL may reduce the size of the first and second fan-out areas FOA1 and FOA2 while reducing the internal resistance of the first driving voltage line VDDL. By including the first source plate portion SDP1 and the second electrode plate portion RMP2, the driving voltage line VDDL may protect the multiple lines disposed under the electrode layer RML from static electricity while reducing signal interference due to coupling capacitance of the fan-out lines FOL.

By including the first electrode plate portion RMP1 in the first fan-out area FOA1 and the second source plate portion SDP2 in the second fan-out area FOA2, the low-potential line VSSL may reduce the size of the first and second fan-out areas FOA1 and FOA2 while reducing the internal resistance of the low-potential voltage line VSSL. By including the first electrode plate portion RMP1 and the second source plate portion SDP2, the low-potential line VSSL may protect the multiple lines disposed under the electrode layer RML from static electricity while reducing signal interference due to coupling capacitance of the fan-out lines FOL.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:
1. A display device comprising:
a display area comprising pixels;
a fan-out area disposed on a side of the display area;
a pad area disposed on a side of the fan-out area;
a display driver electrically connected to the pad area and driving the pixels;
a metal layer disposed on a substrate;
a data line, a first voltage line, and a second voltage line extending in a first direction on the metal layer in the display area;
a fan-out line electrically connecting the data line to the display driver on the metal layer in the fan-out area;

a gate line disposed on the metal layer in the display area and extending in a second direction intersecting the first direction;
a source-drain layer disposed on the gate line; and
an electrode layer disposed on the source-drain layer, wherein
the first voltage line comprises a first plate portion disposed on the source-drain layer in the fan-out area, and
the second voltage line comprises a second plate portion disposed on the electrode layer in the fan-out area.

2. The display device of claim 1, wherein
the first voltage line is a driving voltage line supplying a driving voltage to the pixel, and
the second voltage line is a low potential line supplying a low potential voltage to the pixel.

3. The display device of claim 1, wherein
the first voltage line is a low potential line supplying a low potential voltage to the pixel, and
the second voltage line is a driving voltage line supplying a driving voltage to the pixel.

4. The display device of claim 1, wherein
a distance between the source-drain layer and the metal layer is equal to or greater than about 10,000 angstroms (Å), and
a distance between the electrode layer and the source-drain layer is equal to or greater than about 10,000 angstroms (Å).

5. The display device of claim 1, further comprising:
a buffer layer disposed on the substrate and the metal layer;
a gate insulating layer disposed on the buffer layer; and
an interlayer insulating layer disposed on the gate insulating layer and the gate line,
wherein a sum of thicknesses of the buffer layer, the gate insulating layer, and the interlayer insulating layer is equal to or greater than about 10,000 angstroms (Å).

6. The display device of claim 1, further comprising:
a passivation layer disposed on the source-drain layer; and
a via layer disposed on the passivation layer to support the electrode layer,
wherein a sum of thicknesses of the passivation layer and the via layer is equal to or greater than about 10,000 angstroms (Å).

7. The display device of claim 1, wherein the fan-out line, the first plate portion, and the second plate portion overlap each other in a thickness direction in the fan-out area.

8. The display device of claim 1, wherein an area of the second plate portion is greater than an area of the first plate portion.

9. The display device of claim 1, wherein a width of the second voltage line is greater than a width of the first voltage line.

10. The display device of claim 1, further comprising:
a third voltage line extending in the first direction on the metal layer in the display area,
wherein the third voltage line is electrically connected between the pixel and the fan-out line.

11. A display device comprising:
a display area comprising pixels;
first and second fan-out areas;
first and second pad areas respectively corresponding to the first and second fan-out areas;
a first display driver electrically connected to the first pad area and a second display driver electrically connected to the second pad area;
a metal layer disposed on a substrate;
a data line, a first voltage line, and a second voltage line extending in a first direction on the metal layer in the display area;
a fan-out line electrically connecting the data line to the first display driver on the metal layer in the first fan-out area and electrically connecting the data line to the second display driver on the metal layer in the second fan-out area;
a gate line disposed on the metal layer in the display area and extending in a second direction intersecting the first direction;
a source-drain layer disposed on the gate line; and
an electrode layer disposed on the source-drain layer, wherein
the first voltage line comprises:
a first source plate portion disposed on the source-drain layer in the fan-out area; and
a second electrode plate portion disposed on the electrode layer in the second fan-out area, and
the second voltage line comprises:
a first electrode plate portion disposed on the electrode layer in the first fan-out area, and
a second source plate portion disposed on the source-drain layer in the second fan-out area.

12. The display device of claim 11, wherein the first and second fan-out areas are alternately disposed on a side of the display area.

13. The display device of claim 11, wherein
the first voltage line is a driving voltage line supplying a driving voltage to the pixel, and
the second voltage line is a low potential line supplying a low potential voltage to the pixel.

14. The display device of claim 11, wherein
the first voltage line is a low potential line supplying a low potential voltage to the pixel, and
the second voltage line is a driving voltage line supplying a driving voltage to the pixel.

15. The display device of claim 11, wherein
a distance between the source-drain layer and the metal layer is equal to or greater than about 10,000 angstroms (Å), and
a distance between the electrode layer and the source-drain layer is equal to or greater than about 10,000 angstroms (Å).

16. The display device of claim 11, further comprising:
a buffer layer disposed on the substrate and the metal layer;
a gate insulating layer disposed on the buffer layer; and
an interlayer insulating layer disposed on the gate insulating layer and the gate line,
wherein a sum of thicknesses of the buffer layer, the gate insulating layer, and the interlayer insulating layer is equal to or greater than about 10,000 angstroms (Å).

17. The display device of claim 11, further comprising:
a passivation layer disposed on the source-drain layer; and
a via layer disposed on the passivation layer to support the electrode layer,
wherein a sum of thicknesses of the passivation layer and the via layer is equal to or greater than about 10,000 angstroms (Å).

18. The display device of claim 11, wherein
an area of the first electrode plate portion is greater than an area of the first source plate portion, and
an area of the second electrode plate portion is greater than an area of the second source plate portion.

19. The display device of claim 11, wherein
the fan-out line, the first source plate portion, and the first electrode plate portion overlap each other in a thickness direction of the substrate in the first fan-out area, and
the fan-out line, the second source plate portion, and the second electrode plate portion overlap each other in the thickness direction in the second fan-out area.

20. The display device of claim 11, further comprising:
a third voltage line extending in the first direction on the metal layer in the display area,
wherein the third voltage line is electrically connected between the pixel and the fan-out line.

\* \* \* \* \*